(12) United States Patent
Miura

(10) Patent No.: US 7,507,621 B2
(45) Date of Patent: Mar. 24, 2009

(54) METHOD OF MANUFACTURING SEMICONDUCTOR DEVICE

(75) Inventor: Jirou Miura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 437 days.

(21) Appl. No.: 11/322,287

(22) Filed: Jan. 3, 2006

(65) Prior Publication Data

US 2007/0048963 A1 Mar. 1, 2007

(30) Foreign Application Priority Data

Aug. 31, 2005 (JP) ............................. 2005-252724

(51) Int. Cl.
*H01L 21/8242* (2006.01)
(52) U.S. Cl. .................... 438/240; 438/253; 438/396; 257/E21.002
(58) Field of Classification Search ............. 438/240, 438/253, 396
See application file for complete search history.

(56) References Cited

U.S. PATENT DOCUMENTS

| 2004/0043517 A1* | 3/2004 | Sashida ...................... 438/3 |
| 2004/0046185 A1* | 3/2004 | Sashida ..................... 257/200 |
| 2005/0098815 A1* | 5/2005 | Okita et al. ............... 257/306 |

FOREIGN PATENT DOCUMENTS

| JP | 9-307074 | 11/1997 |
| JP | 11-126883 | 5/1999 |
| JP | 2000-164817 | 6/2000 |
| JP | 2003-273325 | 9/2003 |
| JP | 2004-95861 | 3/2004 |
| WO | WO2004/095578 | * 11/2004 |

OTHER PUBLICATIONS

Minamikawa et al., "Preparation of SiNx passivation films for PZT ferroelectric capacitors at low substrate temperatures by catalytic CVD", Thin Solid Films, vol. 395, 2001, pp. 284-287.*
Wolf, S. and Tauber, R.N., "Silicon Processing for the VLSI Era", vol. 1, pp. 537-546, 1986.*
Toshiharu Minamikawa et al., "Preparation of SiN$_x$ Passivation for PZT Ferroelectric Capacitors by Catalytic Chemical Vapor Deposition".

* cited by examiner

*Primary Examiner*—Zandra V. Smith
*Assistant Examiner*—Christy L Novacek
(74) *Attorney, Agent, or Firm*—Fujitsu Patent Center

(57) ABSTRACT

Provided is a method of manufacturing a semiconductor device including the steps of: forming a first insulating film on a silicon substrate; forming a capacitor in which a lower electrode, a capacitor dielectric film configured of ferroelectric material, and an upper electrode are laminated in this order on the first insulating film; forming a silicon nitride film by a catalytic CVD method as a first capacitor protect insulating film covering the capacitor and the first insulating film; and forming a second insulating film on the first capacitor protect insulating film.

17 Claims, 13 Drawing Sheets

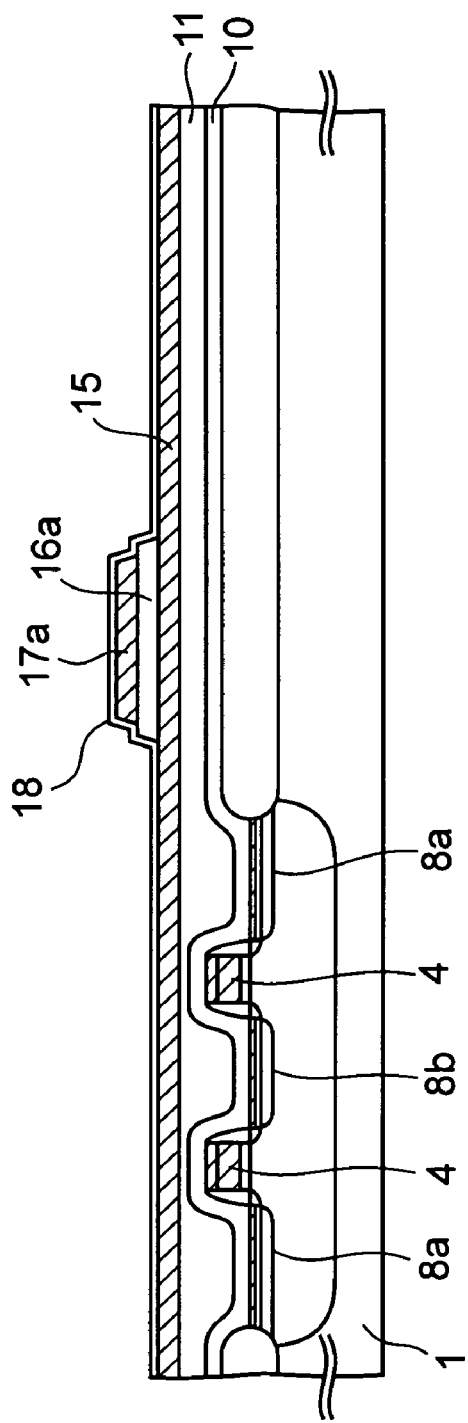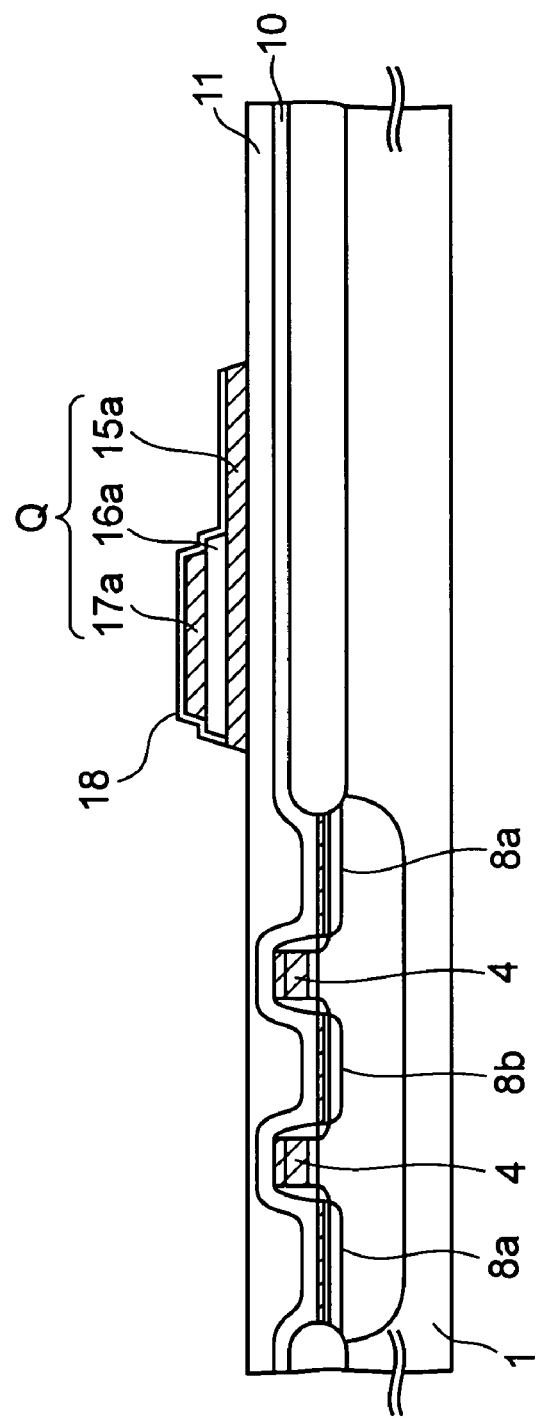

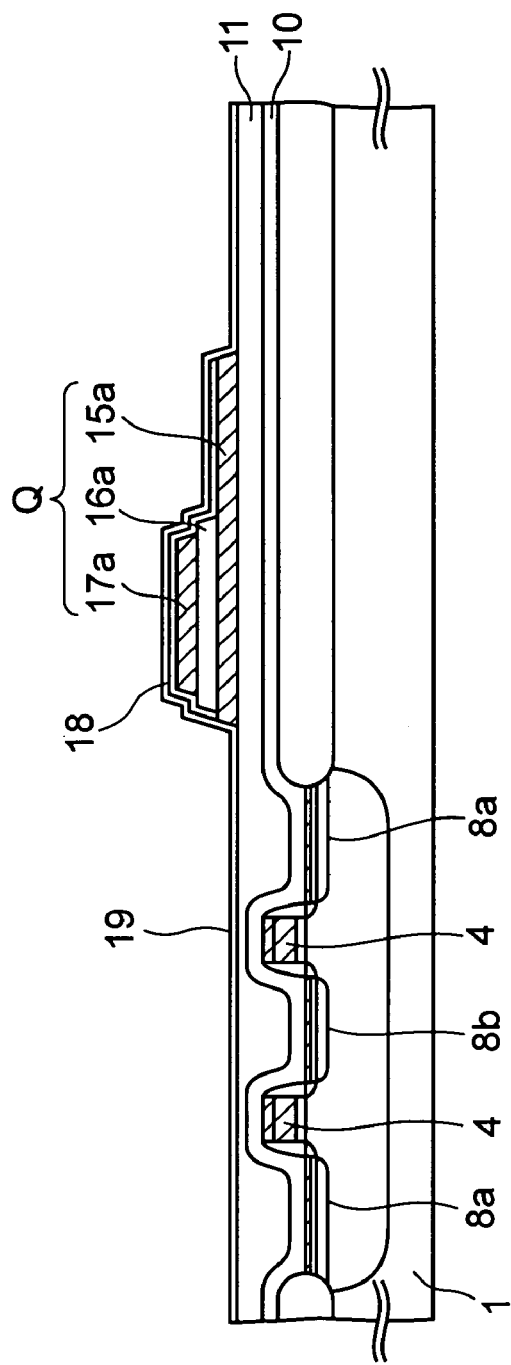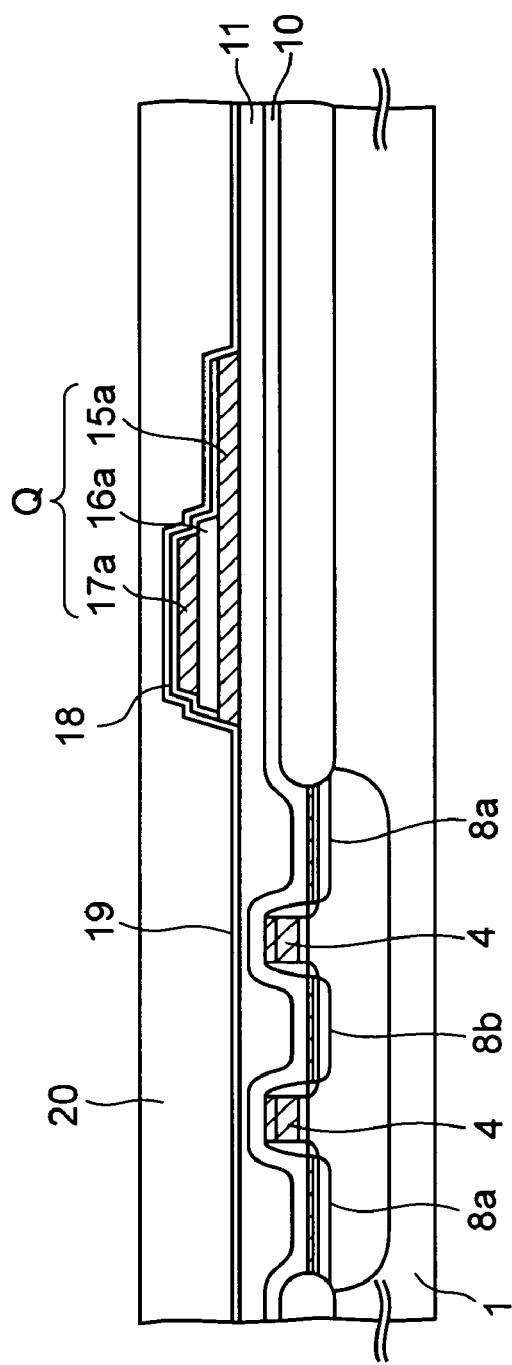

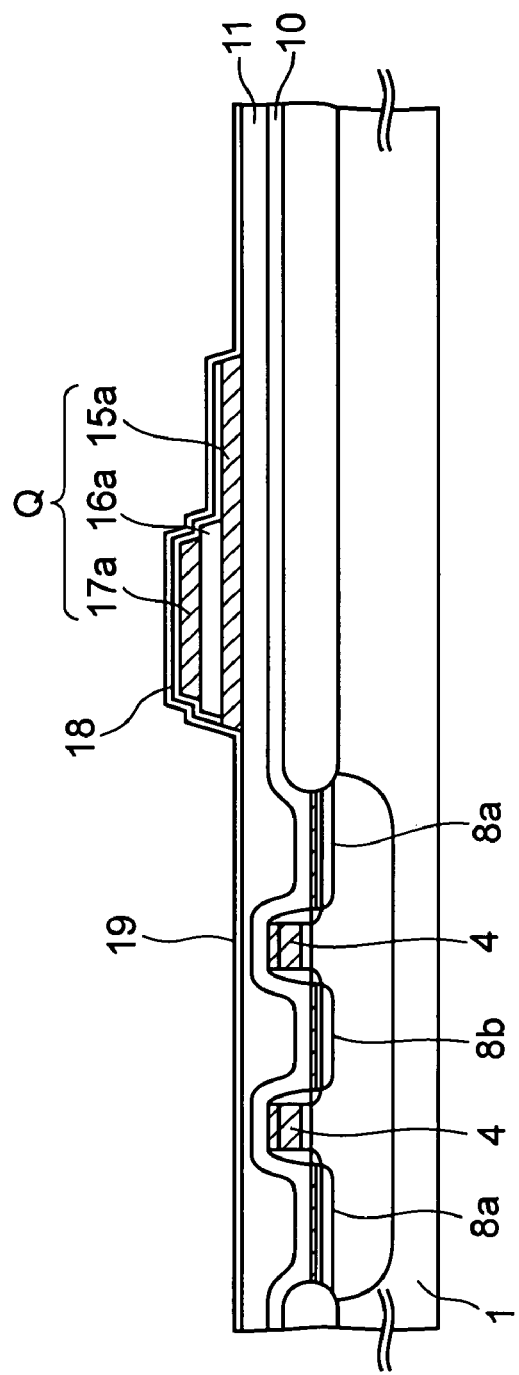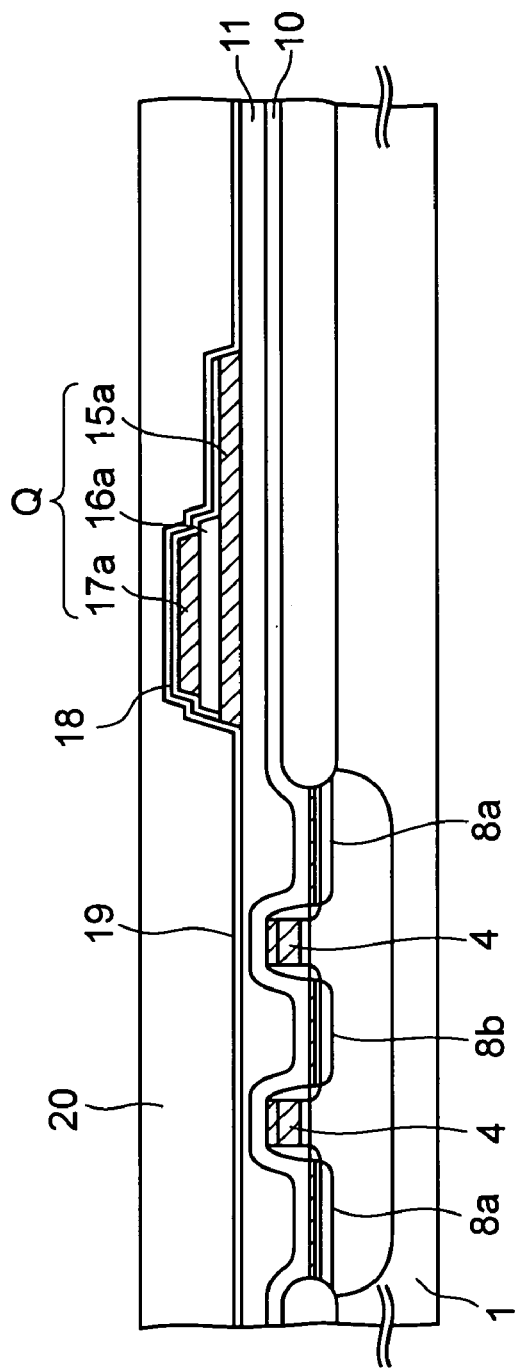
FIG. 2A
FIG. 2B

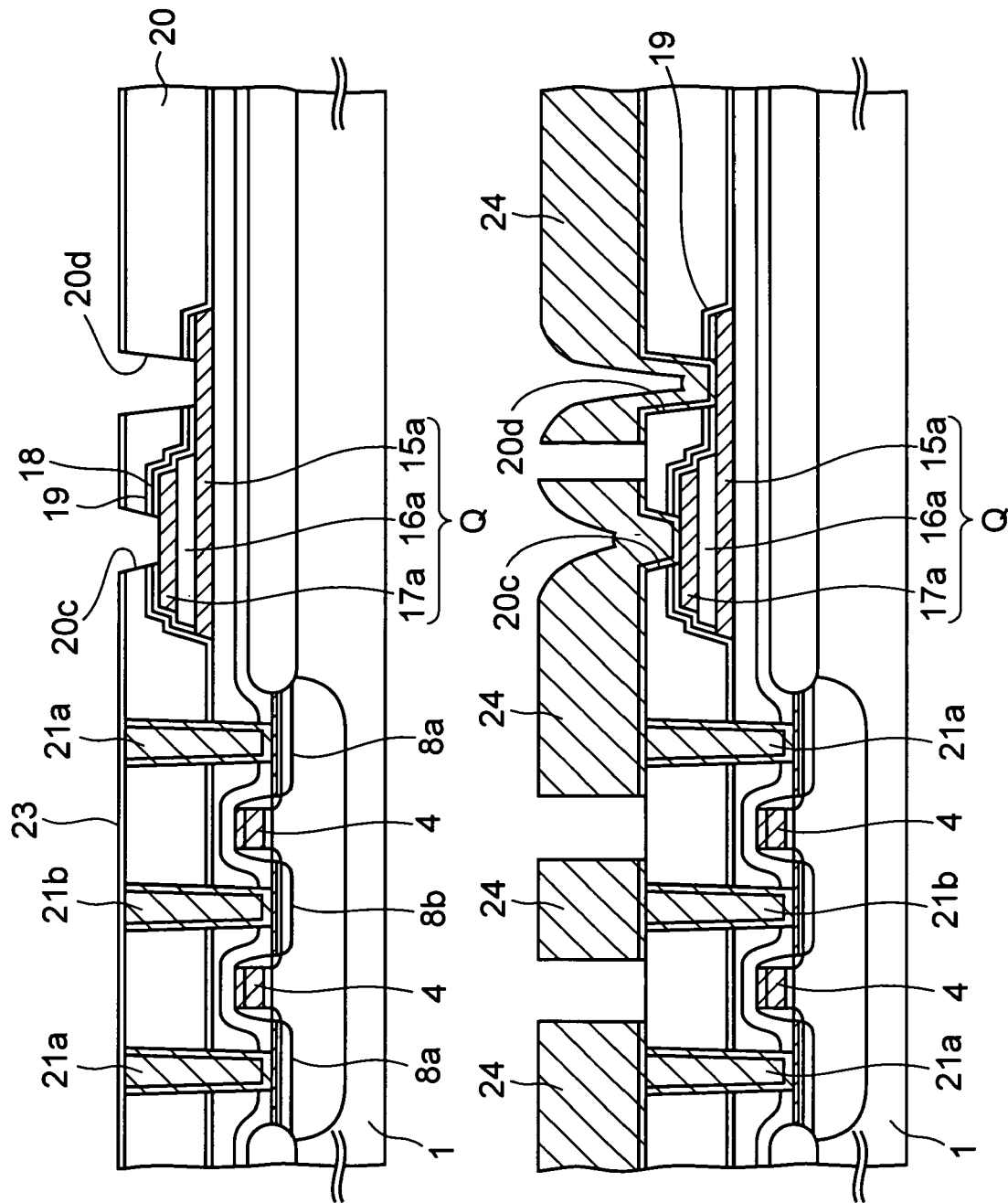

METHOD OF MANUFACTURING SEMICONDUCTOR DEVICE

CROSS-REFERENCE TO RELATED APPLICATIONS

This application is based on and claims priority of Japanese Patent Application No. 2005-252724 filed on Aug. 31, 2005, the entire contents of which are incorporated herein by reference.

BACKGROUND OF THE INVENTION

1. Field of the Invention

The present invention relates to a method of manufacturing a semiconductor device.

2. Description of the Related Art

A flash memory and a ferroelectric memory are well-known as nonvolatile memories capable of storing information even after a power supply is turned off.

The flash memory includes a floating gate that is embedded in a gate insulating film of an insulated gate filled effect transistor (IGFET), and stores information by accumulating electric charges indicating recording information. However, there is a drawback in that the flash memory requires relatively high voltage because it is necessary to flow the tunnel current to the gate insulating film at the time of writing and erasing the information.

On the other hand, the ferroelectric memory, which is also referred to as FeRAM (Ferroelectric Random Access Memory), stores information by utilizing the hysteresis property of a ferroelectric film provided in a ferroelectric capacitor. The ferroelectric film causes polarization in response to the voltage applied between upper and lower electrodes of the capacitor, and spontaneous polarization remains even after the voltage is removed. When the polarity of the applied voltage is reversed, the polarity of the spontaneous polarization is also reversed. By bringing the direction of the polarity to correspond to "1" and "0", the information is written in the ferroelectric film. The voltage required for the FeRAM to carry out writing is lower than that for the flash memory to carry out writing. In addition, there is also an advantage in that the FeRAM is capable of writing at a higher rate than the flash memory.

In a process of manufacturing the FeRAM, a silane ($SiH_4$) gas or a TEOS gas is used as a deposition gas at the time of forming an interlayer insulating film made of oxide silicon which is formed in the upper portion of the capacitor by a chemical vapor deposition (CVD) method. These gases release hydrogen to a deposition atmosphere by decomposition at the time of deposition. However, it is known that when the capacitor dielectric film comes in contact with reductant such as hydrogen, it causes shortage of oxygen because oxygen in the film is deoxidized, thereby causing the deterioration of ferroelectric property, such as residual amount of polarized electric charges, of capacitor dielectric film. For example, when the capacitor dielectric film is heated in an atmosphere with hydrogen having partial pressure of 40 Pa, the ferroelectricity of the capacitor dielectric film is substantially lost, thereby causing the remarkable deterioration of hysteresis curve.

In addition, even when the capacitor dielectric film is heated in a situation with water in the vicinity, the ferroelectricity is deteriorated because, similar to the above case, water serves as the reductant to deoxidize the capacitor dielectric film.

In this manner, the capacitor dielectric film is deteriorated under the circumstance that heat and reductant are co-existed. Therefore, this type of FeRAM requires a protective film to protect the capacitor from a reducing atmosphere.

For example, as set forth in Japanese published unexamined application No. 1997-307074, a capacitor is covered by an oxide silicon film formed by a sputtering method in which water is hard to be involved, and the oxide silicon film is used as a protective film.

In addition, as set forth in Japanese published unexamined application No. 2003-273325, as shown in its FIG. 2, metal interconnects in the upper portion of the capacitor are covered by a protective film such as a titanium oxide film or an alumina film so that water can be prevented from coming in contact with the metal interconnects so as not to generate hydrogen.

On the other hand, as set forth in Japanese published unexamined application No. 2000-164817, as shown in its FIG. 3, in an iridium film or the like is formed so as to adjust stress of which a capacitor is received, and a protective film made of a silicon nitride film and a silicon oxynitride film is formed thereon.

As set forth in Japanese published unexamined application No. 1999-126883, as shown in its FIG. 1, a TaSiN film having a hydrogen gas blocking property is formed on the upper electrode of a capacitor so that the permeation of hydrogen into a capacitor dielectric film can be prevented.

Other than the above-described methods, by utilizing methods such as a DC sputtering method, an RF sputtering method, an ion beam deposition method, a plasma CVD method, or a sol-gel method, a titanium or aluminum nitride film or ferroelectric film can be formed, and these films can be a protective film to hydrogen.

It should be noted that the related art to the present invention are also set forth in Japanese published unexamined application No. 2004-95861 and "Preparation of SiNx Passivation Films for PZT Ferroelectric Capacitors by Catalytic Chemical Vapor Deposition" written by Toshiharu Minamikawa et al, which is available online on http://www.irii.go.jp/theme/h12/pdf/study02.pdf.

SUMMARY OF THE INVENTION

According to one aspect of the present invention, there is provided a method of manufacturing a semiconductor device, comprising the steps of: forming a first insulating film on a semiconductor substrate; forming a capacitor in which a lower electrode, a capacitor dielectric film made of ferroelectric material and an upper electrode are laminated in this order on the first insulating film; forming a silicon nitride film by a catalytic CVD method as the first capacitor protect insulating film covering the capacitor and the first insulating film; and forming a second insulating film on the first capacitor protect insulating film.

According to the present invention, the silicon nitride film formed by the catalytic CVD method is used as the first capacitor protect insulating film for protecting the capacitor dielectric film from reductant such as hydrogen and water. The catalytic CVD is capable of forming the silicon nitride film having satisfactory step coverage. Therefore, it is possible that the first capacitor protect insulating film has a sufficient thickness at the side surface of the capacitor dielectric film, thereby making it possible to prevent the capacitor dielectric film from deteriorating due to permeation of reductant from the side surface thereof.

Further, the first capacitor protect insulating film formed by the catalytic CVD method has a higher film density than a film, which is formed by other deposition methods such as sputtering method, has. Therefore the first capacitor protect film is excellent in capability of preventing the permeation of the reductant, and can effectively protect the capacitor dielectric film.

The silicon nitride film constituting this first capacitor protect insulating film has a relative dielectric constant of approximately 6.2, and it is lower than the relative dielectric constant of alumina film (9.34). Therefore, the parasitic capacitance between interconnects decreases and a design rule thereof can be reduced.

In addition, in the above-described catalytic CVD method, deposition can be carried out at low temperature. Therefore, heat load that is one of the causes of deteriorating the capacitor dielectric film can be reduced by forming the above first capacitor protect insulating film at the substrate temperature of, for example, 200° C. or lower.

In addition, in the process of forming the capacitor, a metal oxide film as a second capacitor protect insulating film can be formed on the lower electrode, the capacitor dielectric film, and the upper electrode. This second capacitor protect insulating film prevents reductant from permeating into the capacitor dielectric film in cooperation with the first capacitor protect insulating film made of the silicon nitride film.

The capacitor dielectric film can be damaged by etching or sputtering, and shortage of oxygen in the film is caused, thereby causing the ferroelectric property to be easily deteriorated. Therefore, it is preferable that the capacitor dielectric film be annealed in an oxygen atmosphere so as to supplement oxygen which is in short in the film. There could be a case where oxygen does not sufficiently spread into the capacitor dielectric film because of the first capacitor protect insulating film when the anneal is carried out after the first capacitor protect insulating film having a high film density is formed. Therefore, the above anneal is preferably carried out after the second capacitor dielectric film is formed and before the first capacitor protect insulating film is formed. According to this, oxygen reaches at the capacitor dielectric film by permeating the first capacitor protect insulating film so that oxygen in short can be supplemented.

In addition, an impurity diffusion region may be formed in the semiconductor substrate, and a hole may be formed in the first insulating film, the first capacitor protect insulating film and the second insulating film, which are formed on this impurity diffusion region. Since the first capacitor protect insulating film is made of the silicon nitride film, it can be etched by chemical action of an etching gas. Therefore, the hole can be easily formed by etching, and a disadvantage in which diameters of the hole become small under the first capacitor protect insulating film, can be prevented. As a result, even when contact plug to be electrically connected to the impurity diffusion region is formed in the hole, contact resistance of the contact plug can be stabilized since the contact area between the contact plug and the impurity diffusion region is sufficiently secured.

According to the another aspect of the present invention, there is provided a method of manufacturing a semiconductor device, comprising the steps of: forming a first insulating film on a semiconductor substrate; forming a capacitor in which a lower electrode, a capacitor dielectric film made of ferroelectric material and an upper electrode are laminated in this order on the first insulating film; forming a second insulating film covering the capacitor; forming a metal interconnect on the second insulating film; forming a silicon nitride film as the first capacitor protect insulating film on the metal interconnect by a catalytic CVD method; and forming an interlayer insulating film on the first capacitor protect insulating film.

According to the present invention, the metal interconnect is covered by the first capacitor protect insulating film formed by the catalytic CVD method, and thereafter, the interlayer insulating film is formed on the first capacitor protect insulating film. Accordingly, the metal interconnect is not directly exposed to the deposition atmosphere of the interlayer insulating film. Therefore, the generation of water caused by catalysis of the metal interconnect is suppressed and the deterioration of the capacitor dielectric film caused by the water can be also suppressed.

Further, the first capacitor protect insulating film can also suppress the deterioration of the capacitor dielectric film which is caused by a plasma atmosphere at the time of forming the interlayer insulating film.

BRIEF DESCRIPTION OF THE DRAWINGS

FIGS. 1A to 1J are cross-sectional views showing a hypothetical semiconductor device in process of manufacturing;

FIGS. 2A to 2J are cross-sectional views showing a semiconductor device according to an embodiment of the present invention in process of manufacturing.

DESCRIPTION OF THE PREFERRED EMBODIMENT

Detailed descriptions of an embodiment of the present invention will be given by referring to the accompanying drawings.

(1) Preliminary Explanation

Before explaining the embodiment of the present invention, a preliminary explanation of the present invention will be given.

FIGS. 1A to 1J are cross-sectional views showing a hypothetical semiconductor device in process of manufacturing. This semiconductor device is a planar FeRAM, which is formed as follows.

Figure 1A:
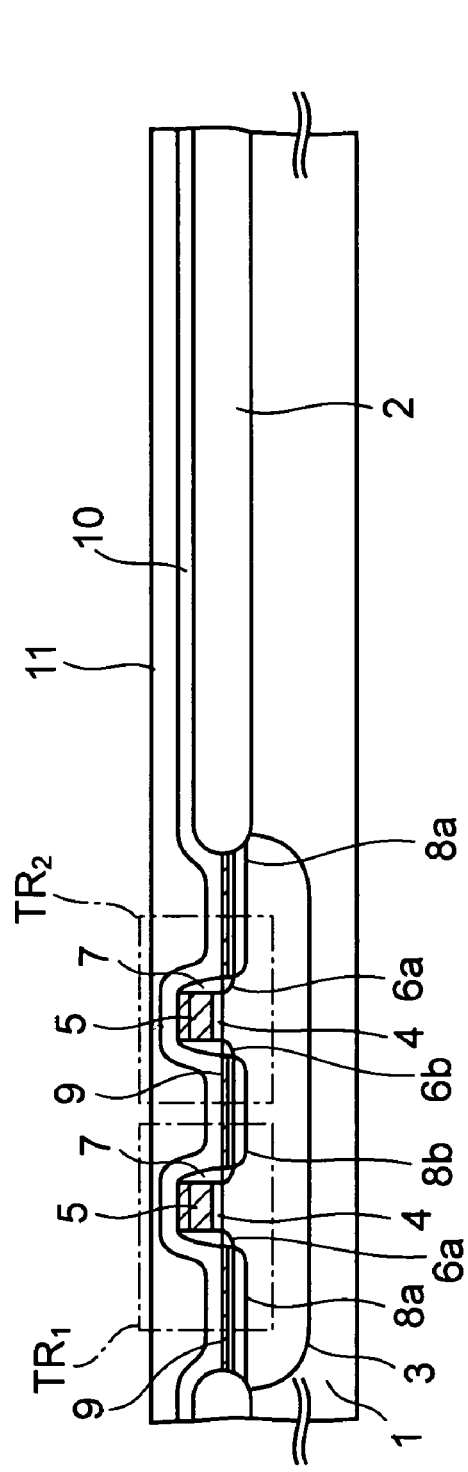

First, steps required until the cross-sectional configuration as shown in FIG. 1A is obtained will be described below.

A thermal oxidation film is formed on a surface of a n-type silicon or p-type silicon (semiconductor) substrate 1 in a device isolation region, and the thermal oxidation film is used as a device isolation insulating film 2. Such a device isolation structure is referred to as LOCOS (Local Oxide action of Silicon), but the present invention is not limited to this, and may use STI (Shallow Trench Isolation) as the device isolation structure.

Next, after introducing p-type impurity into an active region of the silicon substrate 1 to form a p-well 3, a thermal oxidation film to be a gate insulating film 4 is formed by thermally oxidizing the surface of the active region.

Next, an amorphous or polycrystal silicon film is formed on an entire surface of the upper side of the silicon substrate 1, and the silicon film is subjected to patterning by photolithography to form two gate electrodes 5.

The two gate electrodes 5 are arranged parallel to each other at spaced intervals on the p-well 3, and the gate electrodes 5 constitute a part of a word line.

Next, while using the gate electrodes 5 as a mask, n-type impurity is introduced into the silicon substrate 1 beside the gate electrodes 5 by ion implantation, and first and second source/drain extensions 6a and 6b are thus formed.

Then, the insulating film is formed on an entire surface of the upper side of the silicon substrate 1, and insulating sidewalls 7 are formed beside the gate electrodes 5 by etching back the insulating film. As to the insulating film, for example, a silicon oxide film is formed by a CVD method.

Next, by carrying out again the ion implantation of the n-type impurity into the silicon substrate 1 while using the insulating sidewalls 7 and the gate electrodes 5 as a mask, first and second source/drain regions 8a and 8b, which are spaced each other, are formed in the surface layer of the silicon substrate 1 beside the two gate electrodes 5.

By the steps described above, in the active region of the silicon substrate 1, there are formed first and second MOS transistors $TR_1$ and $TR_2$ constructed from the gate insulating film 4, the gate electrodes 5, and the first and second source/drain regions 8a and 8b.

Next, a refractory metal layer such as a cobalt layer is formed on the entire surface of the upper side of the silicon substrate 1 by the sputtering method, and then the refractory metal layer is heated to react with silicon so as to form a refractory metal silicide layer 9 on the silicon substrate 1. This refractory metal silicide layer 9 is also formed on the surface layer of the gate electrodes 5, thereby the resistance of the gate electrodes 5 becomes low.

After that, the refractory metal layer which remains unreacted on the device isolation insulating film 2, or the like, is removed by wet etching.

Next, a silicon nitride (SiN) film having a thickness of approximately 200 nm is formed on the entire surface of the upper side of the silicon substrate 1 by a plasma CVD method, and the silicon nitride film is used as a cover insulating film 10. Then, a silicon oxide film is formed on the cover insulating film 10 as a first insulating film 11 by the plasma CVD method using a TEOS gas, and the upper surface of the first insulating film 11 is planarized by a CMP method. By such a CMP method, a thickness of the first insulating film 11 becomes approximately 610 nm over a flat surface of the silicon substrate 1.

Figure 1B:
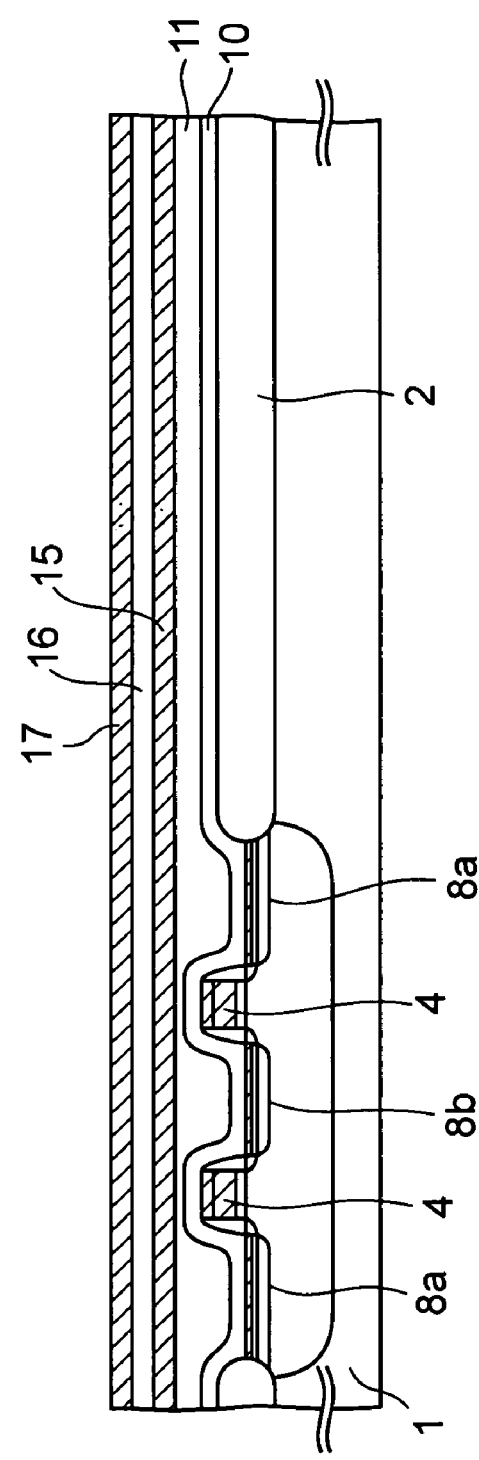

Next, steps required until the cross-sectional structure shown in FIG. 1B is obtained will be described below.

First, a platinum film having a thickness of approximately 150 nm is formed as a first conductive layer 15 on the first insulating film 11 by the sputtering method.

Next, a PZT (Lead Zirconate Titanate: $PbZrTiO_3$) film having a thickness of approximately 150 nm is formed on the first conductive layer 15 by the sputtering method, and the PZT film is used as a ferroelectric film 16. The methods of forming this ferroelectric film 16, other than the sputtering method, include a MOCVD (Metal Organic CVD) method, or a sol-gel method. Further, constituent material of the ferroelectric film 16 are not limited to the above PZT. The ferroelectric film 16 may be any one selected from the group consisting of Bi layered structure compounds such as $SrBi_2Ta_2O_9$ and $SrBi_2(Ta, Nb)_2O_9$, PLZT made by doping lanthanum (La) into the PZT, and other metal oxide ferroelectrics.

In the ferroelectric film 16 formed by the sputtering method, ferroelectric property is deteriorated because crystallization is not caused yet just after the deposition.

Therefore, in the next step, the PZT constituting the ferroelectric film 16 is crystallized by RTA (Rapid Thermal Annealing) in an oxygen-containing atmosphere. The conditions of the RTA are, for example, substrate temperature of 720° C., processing time of 120 seconds, and a temperature rising rate of 125° C./sec. This kind of annealing is referred to as crystallization annealing. It should be noted that in a case where the ferroelectric film 16 is formed by the MOCVD method, this step of annealing is not required since the film is crystallized just after the deposition.

After that, an iridium oxide ($IrO_2$) film having a thickness of approximately 250 nm is formed on the ferroelectric film 16 by the sputtering method, and the iridium oxide film is used as a second conductive film 17.

Figure 1C:
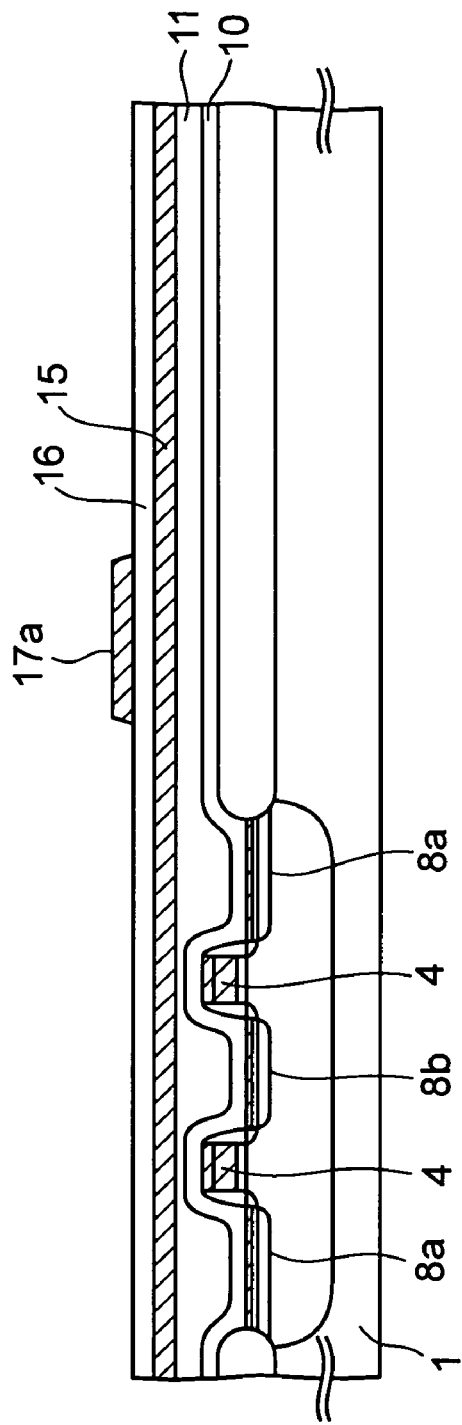

Next, as shown in FIG. 1C, an upper electrode 17a of the capacitor is formed by patterning the second conductive film 17. It should be noted that the above patterning is carried out by sputter etching using a resist pattern (not shown) as a mask, and a halogen gas is included in the etching gas.

After that, annealing is carried out in furnace for approximately 60 minutes under the condition of the substrate temperature of 650° C. in the oxygen-containing atmosphere so that the ferroelectric film 16 damaged by the deposition of the second conductive film 17 and patterning, can be recovered. This kind of annealing is referred to as recovery annealing.

Figure 1D:
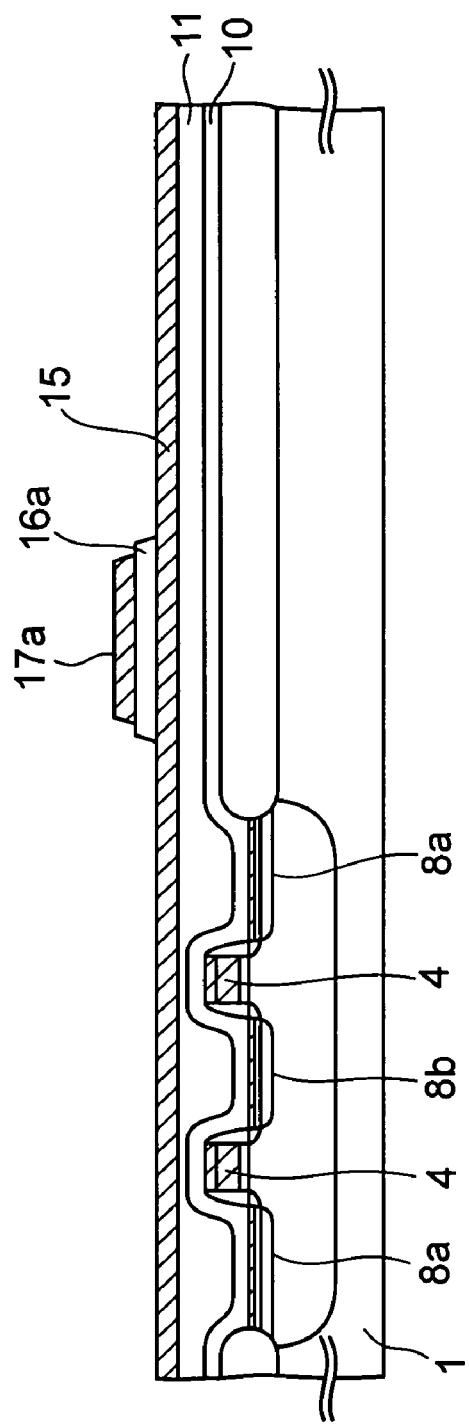

Next, as shown in FIG. 1D, the resist pattern (not shown) covering the upper electrode 17a is formed, and the ferroelectric film 16 is subjected to sputter etching by using this resist pattern as a mask so that a capacitor dielectric film 16a can be formed under the upper electrode 17a. Similar to the patterning of the upper electrode 17a, this patterning also uses a gas containing a halogen gas as an etching gas. In addition, the resist pattern is removed after the capacitor dielectric film 16a is formed.

Next, as shown in FIG. 1E, an alumina ($Al_2O_3$) film having a thickness of approximately 50 nm is formed on the entire surface of the upper surface of the silicon substrate 1 by inductively coupled RF plasma assisted magnetron sputtering method, and the alumina film is used as a second capacitor protect insulating film 18.

This second capacitor protect insulating film 18 protects the capacitor dielectric film 16a from a reducing atmosphere containing hydrogen and water, and functions to prevent the deterioration of the ferroelectric property, for example residual amount of polarized electric charges, of the capacitor dielectric film 16a. By using the above-described inductively coupled RF assisted magnetron sputtering method, the generation of hydrogen in the second capacitor protect insulating film 18 caused during the deposition thereof can be prevented. Therefore, the permeation of hydrogen into the capacitor dielectric film 16a can be easily prevented.

Next, as shown in FIG. 1F, a resist pattern having a shape of lower electrode (not shown) is formed on the second capacitor protect insulating film 18, and this resist pattern is used as a mask to carry out sputter etching to the second capacitor protect insulating film 18 and the first conductive film 15. With this, the lower electrode 15a is formed under the capacitor dielectric film 16a, and a ferroelectric capacitor Q is constructed from the lower electrode 15a, the capacitor dielectric film 16a, and the upper electrode 17a.

It should be noted that an etching gas containing a halogen gas is used at the time of etching the lower electrode 15a. In this etching, the capacitor dielectric film 16a is covered by the second capacitor protect insulating film 18, so that the capacitor dielectric film 16a is protected from damages caused by etching.

Next, after the resist pattern used as a mask is removed, the silicon substrate 1 is again put into the furnace (not shown) so as to recover the damages of which the capacitor dielectric film 16a has been received during the manufacturing steps. Then, the second recovery annealing is carried out for 60 minutes under the condition of the substrate temperature of approximately 350° C. in the oxygen-containing atmosphere.

In the capacitor dielectric film 16a in which the ferroelectric property is relatively deteriorated due to the shortage of oxygen, the amount of oxygen in the film is recovered by the recovery annealing, and excellent ferroelectric property again becomes present.

Next, as shown in FIG. 1G, as a first capacitor protect insulating film 19, an alumina ($Al_2O_3$) film having a thickness of approximately 20 nm is formed on the entire surface of the upper surface of the silicon substrate 1 by the inductively coupled RF plasma assisted magnetron sputtering method.

Next, as shown in FIG. 1H, a silicon oxide film is formed on the first capacitor protect insulating film 19 by the plasma CVD method using a TEOS gas, and this silicon oxide film is used as a second insulating film 20. In addition, to remove unevenness formed on the second insulating film 20 reflecting the shape of the capacitor Q, the upper surface of the second insulating film 20 is polished to be planarized by the CMP method. As a result of the CMP method, a thickness of the second insulating film 20 becomes approximately 400 nm on the flat surface of the first capacitor protect insulating film 19.

Figure 1I:
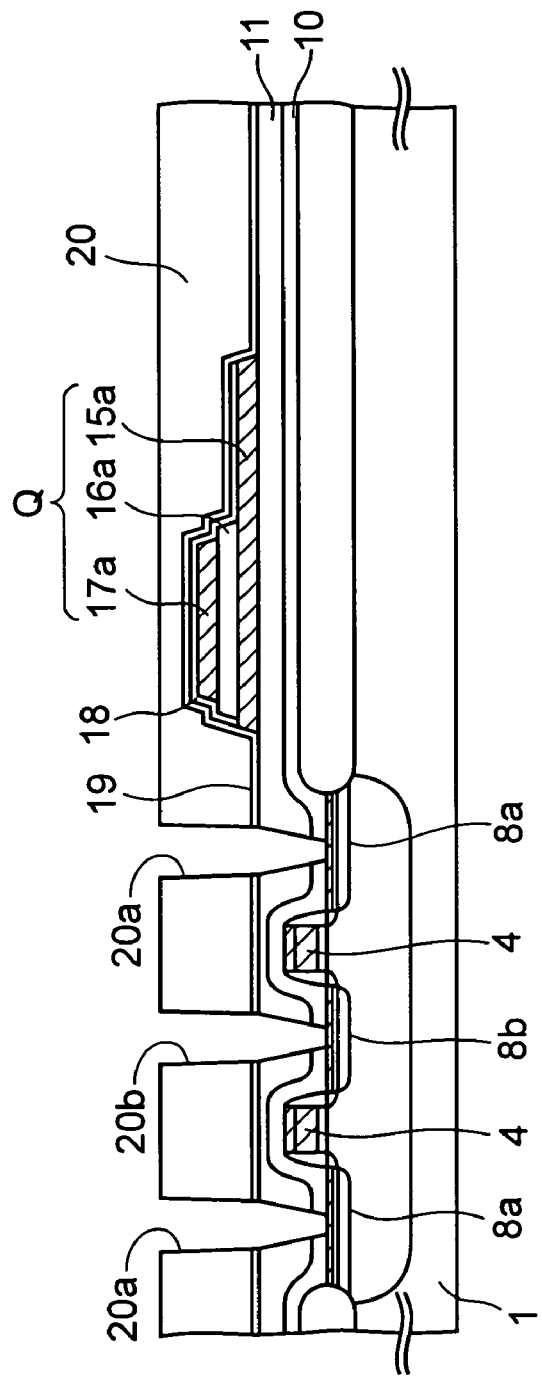

Next, as shown in FIG. 1I, by patterning the second insulating film 20 to the cover insulating film 10 with three-step etching, first and second holes 20a and 20b are respectively formed in these insulating films over the first and second source/drain regions 8a and 8b.

For the first step of this etching, the gas mixture containing $C_4F_8$, Ar, and $O_2$ is used as an etching gas, and the second insulating film 20 is etched in the parallel plate type plasma etching equipment.

In the second step, the gas mixture containing Ar and $O_2$ is used as an etching gas, and the first capacitor protect insulating film 19 is subjected to sputter etching in the parallel plate type plasma etching equipment.

At this time, it is difficult to form holes by etching, since the first capacitor protect insulating film 19 is made of alumina having poor chemical reaction. Therefore, the cross-sectional shapes of the first and second holes 20a and 20b change below the first capacitor protect insulating film 19, and the diameters of the holes 20a and 20b become smaller under the first capacitor protect insulating film 19.

In the third-step etching, the gas mixture containing $C_4F_8$, $CF_4$, Ar, and $O_2$ is supplied to the parallel plate type plasma etching equipment to etch the first insulating film 11 and the cover insulating film 10.

In this three-step etching, in addition to the disadvantage that the diameters of the holes 20a and 20b become smaller under the first capacitor protect insulating film 19, there is also a disadvantage in that etching product containing alumina having poor chemical reaction adheres in the inner surfaces of the holes 20a and 20b, since the first capacitor protect insulating film 19 made of alumina becomes exposed in the inner surfaces of the holes 20a and 20b.

Figure 1J:
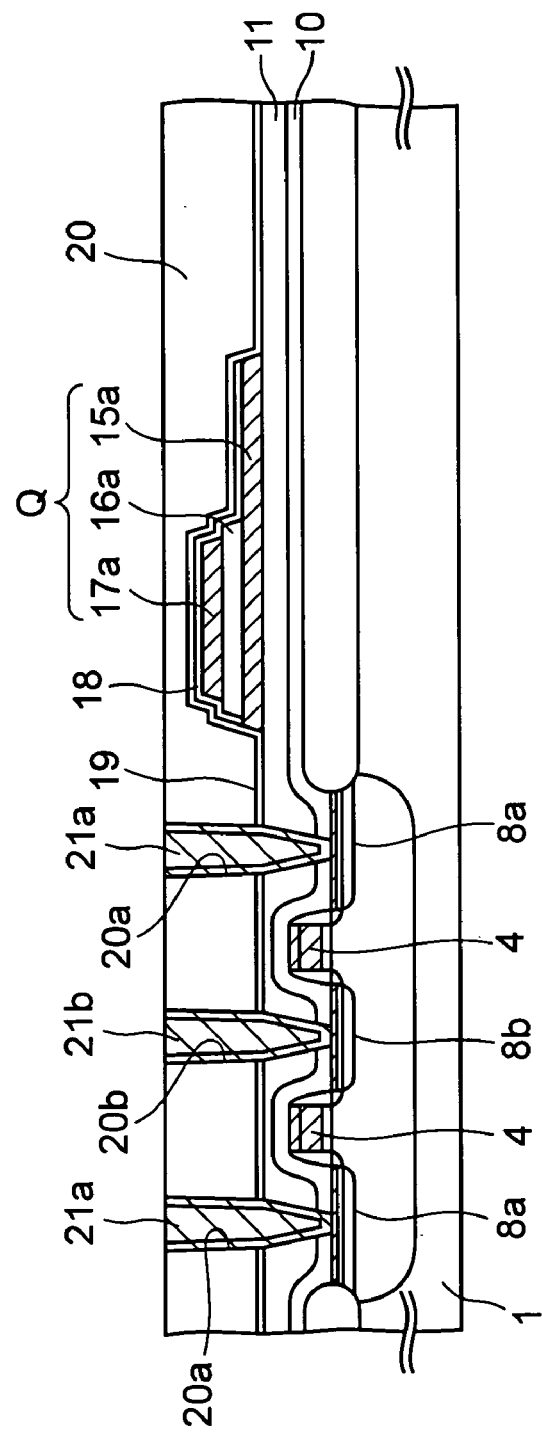

Next, as shown in FIG. 1J, first and second contact plugs 21a and 21b, which are mainly made of tungsten, are respectively formed in the first and second holes 20a and 20b.

As described above, the FeRAM of this example becomes completed.

According to this method of manufacturing the FeRAM, an alumina film is formed as the first capacitor protect insulating film 19.

However, since this alumina film is formed by the sputtering method whose step coverage is poor, the coverage of the first capacitor protect insulating film 19 is decreased. As a result, the thickness of the first capacitor protect insulating film 19 becomes thin in the side surface of the capacitor Q. This causes such a problem that it becomes difficult to securely block hydrogen by the first capacitor protect insulating film 19 on the side surface of the capacitor Q.

Further, as shown in FIG. 1J, since the first capacitor protect insulating film 19 is made of alumina which is difficult to be etched, as described above, the diameters of the holes 20a and 20b become smaller at the bottom portion. Therefore, the contact area between the contact plugs 21a and 21b and the refractory metal silicide layer 9 becomes smaller. With this, contact resistance of each of the contact plugs 21a and 21b becomes unstable, and it becomes difficult to stably supply voltage to the first and second source/drain regions 8a and 8b via each of the contact plugs 21a and 21b.

In addition, the above contact resistance becomes unstable, further by the presence of the etching product containing alumina between the contact plugs 21a and 21b and the refractory metal silicide layer 9, due to the etching product in the holes 20a and 20b.

In this manner, in the above described method of manufacturing a hypothetical FeRAM, there is a problem in that the contact resistance of each of the contact plugs 21a and 21b becomes unstable because the first capacitor protect insulating film 19 is made of alumina.

In order to solve this problem, it may be considered that the first capacitor protect insulating film 19 is made by a material that has a hydrogen blocking property and is easy to be etched compared with alumina, such as silicon nitride.

There is a plasma CVD method that is widely used as a deposition method of silicon nitride film. In this plasma CVD method, substrate temperature at the time of deposition is set to be approximately 300° C. and the gas mixture containing a silane gas and an ammonia ($NH_3$) gas is used as a reaction gas.

However, according to the investigation that has been conducted by the present inventor, it becomes apparent that when a silicon nitride film formed by the plasma CVD method is used as the first capacitor protect insulating film 19, the residual amount of polarized electric charges (Qsw) of the capacitor dielectric film 16a becomes infinitely close to zero, thereby the residual amount of electric charges of about 25 to 30 μC, which are required for operating FeRAM, cannot be obtained.

This is believed that a large amount of hydrogen resulted from silane and ammonia in the reaction gas are present in the deposition atmosphere and the substrate temperature is maintained at high temperature of approximately 300° C. at the time of forming the silicon nitride film by the plasma CVD method, thereby the reducing effect of the capacitor dielectric film 16a by hydrogen is accelerated due to heat, and thus the capacitor dielectric film 16a becomes extremely in short of oxygen.

As describe above, when the residual amount of polarized electric charges of the capacitor dielectric film 16a is considerably decreased, the ferroelectric property of the capacitor dielectric film 16a is lost, and the hysteresis curve thereof is considerably deteriorated. Therefore, the above method is not preferable.

Moreover, in the step following to FIG. 1J, first layer metal interconnects and a second insulating film are formed in this order. When the second insulating film is formed by the plasma CVD method, the capacitor dielectric film 16a is deteriorated by plasma damage. Further, the first layer metal interconnects are exposed to an atmosphere of plasma CVD. Therefore, water is generated on the first layer metal interconnects by the catalytic action of metal, and this water deteriorates the capacitor dielectric film 16a.

As described in the background of the invention, deposition methods of protective film for a capacitor include the DC sputtering, the RF sputtering, the ion beam deposition method, the plasma CVD method, and the sol-gel method. However, an insulating film formed by these deposition methods has low film density, and thus poses a problem that hydrogen diffusion can not be sufficiently suppressed.

In view of the forgoing problems, the present inventor has conceived of a following embodiment of the present invention.

(2) Embodiment of the Present Invention

FIGS. 2A to 2J are cross-sectional views showing a semiconductor device according to an embodiment in process of manufacturing. It should be noted that the reference symbols used in FIGS. 1A to 1J are used for the corresponding elements of FIGS. 2A to 2J, and the descriptions thereof will be omitted below.

Figure 3:
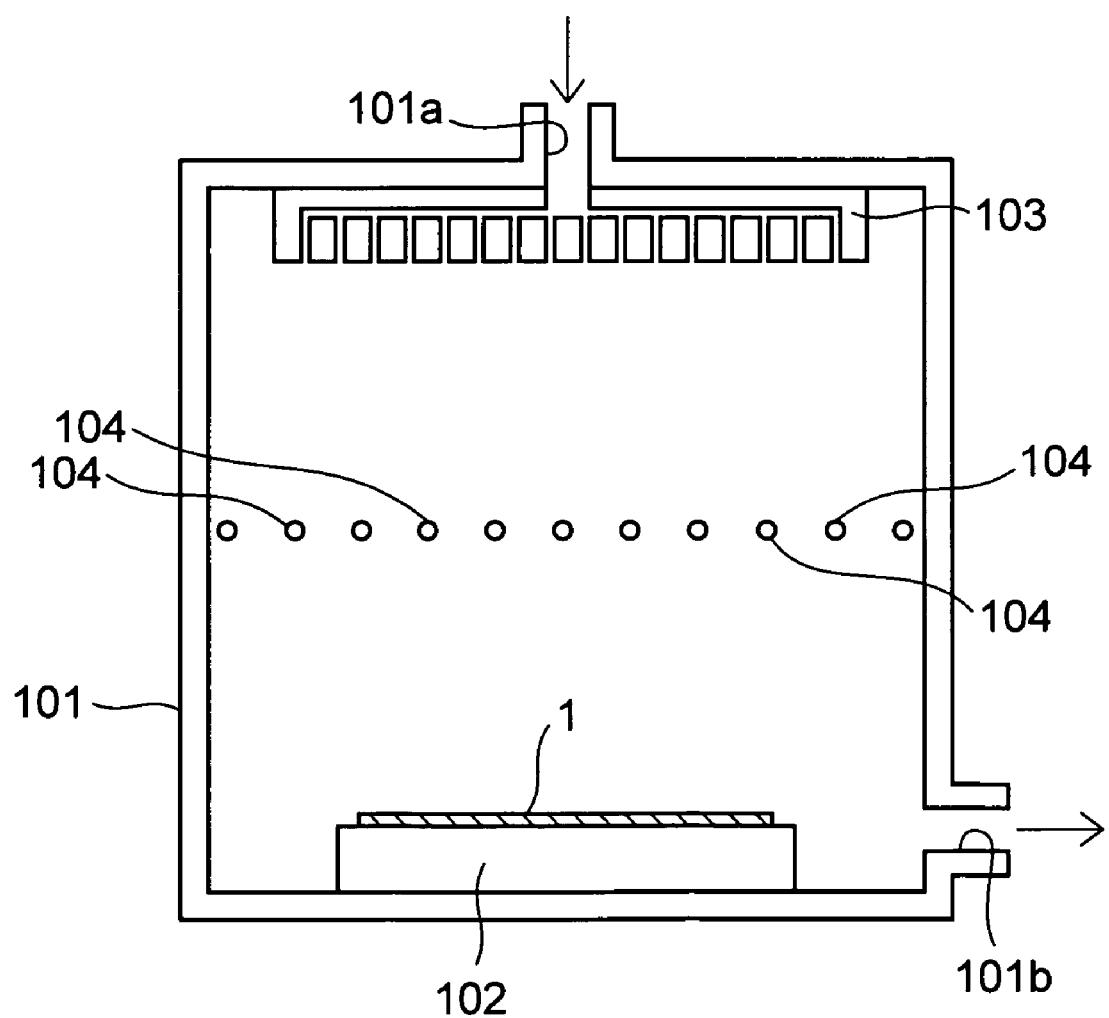
FIG. 3 is a configuration view of a catalytic CVD equipment used for the embodiment of the present invention.

FIG. 3 is a configuration view of a catalytic CVD equipment used for the present embodiment.

First, steps required until the cross-sectional view shown in FIG. 2A is obtained will be described below.

After carrying out the above-described steps shown in FIGS. 1A to 1F, a silicon substrate 1 is put into the catalytic CVD equipment shown in FIG. 3.

This catalytic CVD equipment is provided with a chamber 101 having a gas supply opening 101a and a gas exhaust opening 101b, and a substrate mounting table 102, on which the silicon substrate 1 is mounted, in the bottom of the camber 101. It should be noted that the substrate mounting table 102 can heat the silicon substrate 1 to desired temperature by a heater (not shown). In addition, on an upper side of the substrate mounting table 102, catalysts 104 made of tungsten wire and a shower head 103, from which the reaction gas supplied from the gas supply opening 101a is dispersed into the chamber, are disposed.

In this step, by using such a catalytic CVD equipment, the silicon substrate 1 is heated to 200° C. or lower temperature, for example about 200° C. At the same time, the electrical power of approximately 1000 W is applied to the catalysts 104 made of tungsten wire, and thus the catalysts 104 are heated to approximately 1800° C. by Joule heat.

Next, when the temperature of the silicon substrate becomes stable, a silane gas with a flow rate of 50 sccm and an ammonia gas with a flow rate of 500 sccm are supplied as the reaction gas to the camber 101, and the pressure of the inside of the chamber 101 is decompressed to about 4 Pa by a decompression pump (not shown) connected to the gas discharge opening 101b.

Then, as shown in FIG. 2A, such a state is kept for about 48 to 120 seconds, so that a silicon nitride film covering the first insulating film 11 and the capacitor Q is formed to have a thickness from 20 to 100 nm, approximately 20 nm for example, and this silicon nitride film is used as a first capacitor protect insulating film 19.

The first capacitor protect insulating film 19 formed by the catalytic CVD method has better step coverage compared with an alumina film formed by the sputtering method. Therefore, the thickness of the first capacitor protect insulating film 19 can be sufficiently large on the side surface of the capacitor dielectric film 16a. Therefore, the capacitor protect insulating film 19 can easily prevent reductant, such as hydrogen, from permeating from the side surface of the capacitor dielectric film 16a.

In addition, although the deposition atmosphere contains hydrogen due to silane and ammonia, the above-described catalytic CVD method is capable of lowering the substrate temperature below or equal to 200° C. at the time of the deposition. Therefore, the catalytic CVD method can prevent deterioration of the capacitor dielectric film 16a, which occurs when hydrogen is present under the high substrate temperature as in the case of forming the silicon nitride film by the plasma CVD method. As such, the ferroelectric property of the capacitor dielectric film 16a can be maintained even after the first capacitor protect insulating film 19 is formed.

Further, the silicon nitride film formed by the catalytic CVD method has a higher film density than the silicon nitride film formed by the plasma CVD method has. Therefore, the first capacitor protect insulating film 19 has excellent hydrogen blocking property.

After forming such a first capacitor protect insulating film 19, as shown in FIG. 2B, a silicon oxide film is formed on the first capacitor protect insulating film 19 by the plasma CVD method using a TEOS gas, and the silicon oxide film is used as a second insulating film 20.

In the deposition atmosphere of this second insulating film 20, hydrogen resulted from the TEOS gas is present. However, since the first capacitor protect insulating film 19 is made of the silicon nitride film having a high film density, the first capacitor protect insulating film 19 can securely prevent the hydrogen from permeating to the capacitor dielectric film 16a.

After that, an upper surface of the second insulating film 20 is polished and planarized by the CMP method, and a thickness of the second insulating film 20 becomes approximately 1020 nm over the flat surface of the first capacitor protect insulating film 19.

Figure 2C:
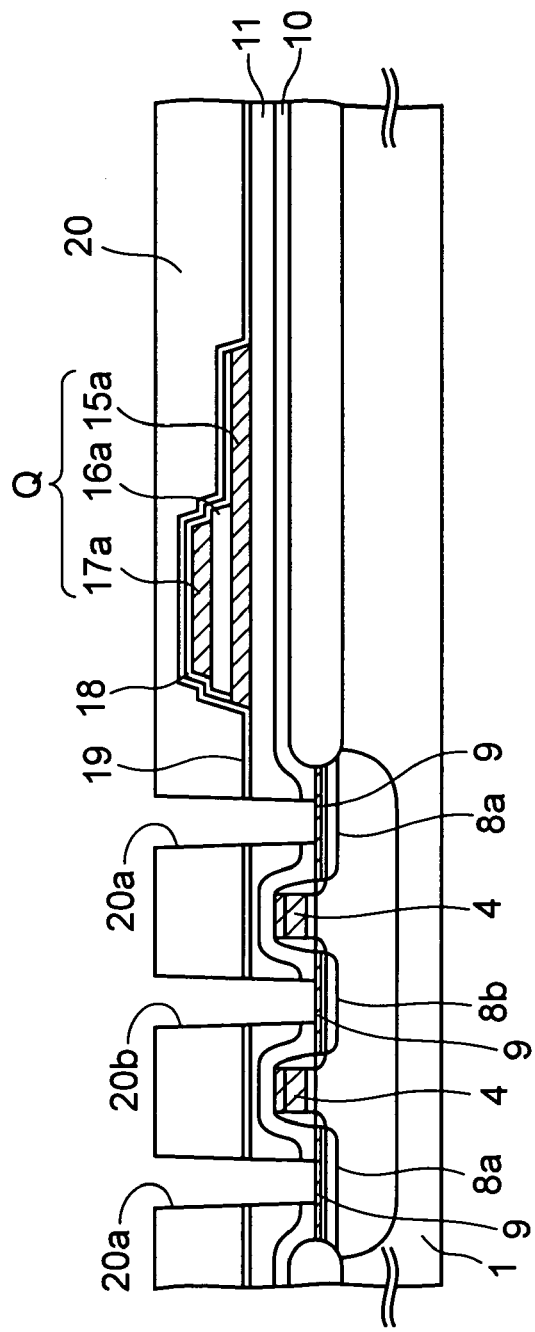

Next, as shown in FIG. 2C, by pattering the second insulating film 20, the first capacitor protect insulating film 19, the first insulating film 11, and the cover insulating film 10, first and second holes 20a and 20b are formed in these insulating films over the first and second source/drain regions 8a and 8b.

This patterning is carried out by two-step etching using a parallel plate type plasma etching equipment (not shown).

In the first step of the two-step etching, high frequency powers, which are applied to the upper electrode and substrate mounting table of the parallel plate type plasma etching equipment respectively, are set to be 2000 W and 900 W respectively. In addition, the gas mixture containing $C_4F_8$, Ar, and $O_2$ is used as an etching gas, and the pressure of an etching atmosphere is set to be 6.6 Pa. By using such an etching gas, the second insulating film 20 is etched, while using the first capacitor protect insulating film 19 made of the silicon nitride film as an etching stopper.

In the second step, remaining first capacitor protect insulating film 19, first insulating film 20, and cover insulating film 10 are etched by changing the etching gas in the etching conditions of the first step to the gas mixture containing $C_4F_8$, $CF_3$, Ar, and $O_2$.

The etching of the first capacitor protect insulating film 19 in the second step is mainly carried out by the chemical reaction with the etching gas since the first capacitor protect insulating film 19 is made of silicon nitride which easily causes chemical reaction compared with alumina. Therefore, it becomes unnecessary to rely only on the sputtering action of the etching gas for etching the first capacitor protect insulating film 19 as in the case where the first capacitor protect insulating film 19 is formed by alumina film having poor chemical reaction, so that the etching of the first capacitor protect film 19 can be carried out easily. Therefore, the phenomenon that diameters of the holes 20a and 20b become smaller under the first capacitor protect insulating film 19 as described in FIG. 1I can hardly occurs, thereby increasing the processing accuracy of the holes 20a and 20b.

Figure 2D:
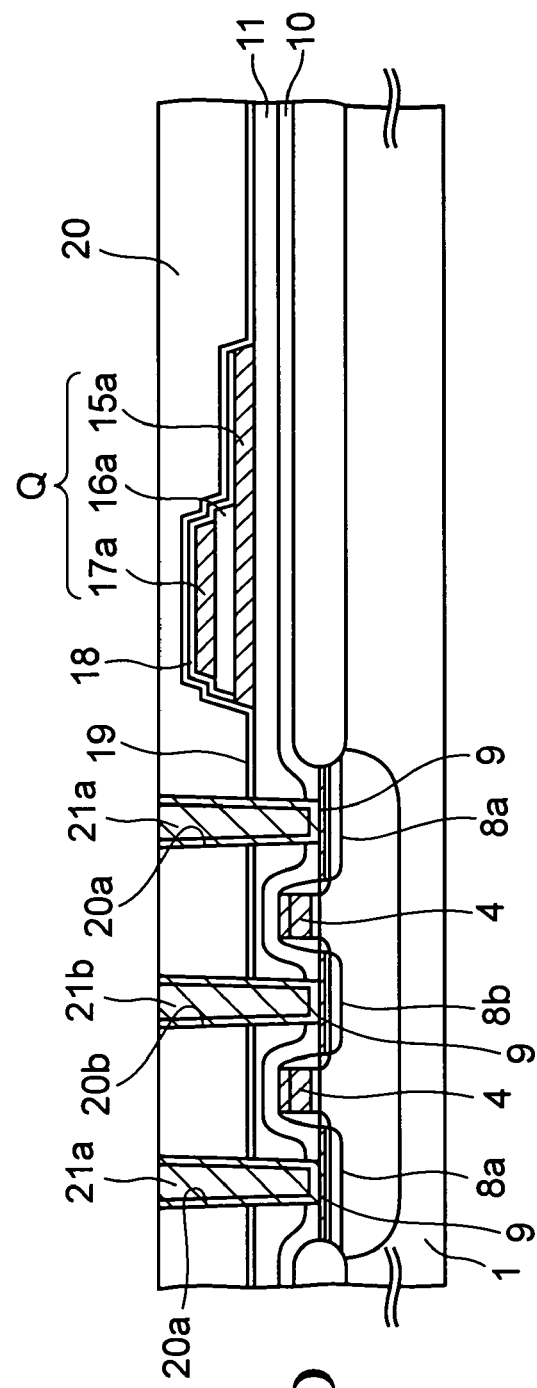

Next, steps required until the cross-sectional structure shown in FIG. 2D is obtained will be described below.

First, on the inner surfaces of the first and second holes 20a and 20b and the upper surface of the second insulating film 20, a titanium nitride film having a thickness of approximately 70 nm is formed as a glue film by the sputtering method. Thereafter, a tungsten film is formed on the glue film by the CVD method, and the holes 20a and 20b are completely embedded by this tungsten film.

After that, the excessive glue film and tungsten film on the second insulating film 20 are polished and removed by CMP method. As a result, the glue film and the tungsten film are left in the first and second holes 20a and 20b as first and second contact plugs 21a and 21b. The first and second plugs 21a and 21b are electrically connected to the first and second source/drain regions 8a and 8b via a refractory metal silicide layer 9.

As described above, in the present embodiment, the disadvantage that the diameters of the holes 20a and 20b become smaller can be avoided. Therefore, the contact area between these contact plugs 21a and 21b and the refractory metal silicide layer 9 becomes larger, thereby stabilizing the contact resistance of the contact plugs 21a and 21b.

Although the glue film constituting the first and second contact plugs 21a and 21b is formed by the sputtering method in the present embodiment, the titanium nitride film formed by the CVD method may be used for the glue film. The CVD method can form a glue film which is more excellent in step coverage compared with the supporting method. Therefore, even when the diameters of the first and second holes 20a and 20b become smaller due to miniaturization of semiconductor device, the inner surfaces of these holes are satisfactorily covered by the glue film. Therefore, the contact failure of the first and second contact plugs 21a and 21b can be prevented from occurring, and the above method can contribute to the minimization of semiconductor devices.

Further, in the case where the glue film is formed by the CVD method, the reductant such as hydrogen is included in the deposition atmosphere. However, the deterioration of the capacitor dielectric film 16a resulted from the hydrogen is prevented by the first capacitor protect insulating film 19.

Similarly, the tungsten film constituting the contact plugs 21a and 21b is formed by the CVD method using a tungsten hexafluoride gas and a hydrogen gas as the deposition gas, so that hydrogen is present in the deposition atmosphere. However, hydrogen is blocked by the first capacitor protect insulating film 19, and is made to be difficult to permeate to the capacitor dielectric film 16a.

Next, steps required until the cross-sectional configuration as shown in FIG. 2E is obtained will be described below.

First, on an entire surface of the silicon substrate 1, a silicon oxynitride (SiON) film is formed as an oxidation preventing insulating film 23 for preventing the oxidization of the first and second contact plugs 21a and 21b. This silicon oxynitride film is formed by the CVD method using the gas mixture containing silane and $N_2O$ as a reaction gas for example.

Next, a photo-resist (not shown) is coated on the oxidation preventing insulating film 23, and is exposed and developed to form a resist pattern having a window over each of the upper electrode 17a and the lower electrode 15a. Then, while using this resist pattern as a mask, the oxidation preventing insulating film 23 and the second insulating film 20 is etched, so that third and fourth holes 20c and 20d are formed above each of the upper electrode 17a and the lower electrode 15a. In this etching, the capacitor protect insulating films 18 and 19 under the third and fourth holes 20c and 20d are also etched, and the upper electrode 17a and lower electrode 15a are exposed from the holes 20c and 20d.

After the resist pattern used as a mask is removed, the capacitor dielectric film 16a is annealed in the oxygen-containing atmosphere under the conditions of substrate temperature of 500° C. and processing time of 60 minutes, so that the damage, which the capacitor dielectric film 16a suffers during the above steps, is recovered.

In this case, the first and second contact plugs 21a and 21b are prevented from being oxidized by the oxidation preventing insulating film 23.

Next, steps required until the cross-sectional configuration shown in FIG. 2F is obtained will be described below.

First, the oxidation preventing insulating film 23 is removed by dry etching using CF based gas.

Next, on each of the upper surfaces of the second insulating film 20 and the first and second contact plugs 21a and 21b, and on the inner surface of the third and fourth holes 20c and 20d, a titanium nitride film and a copper-containing aluminum film are formed in this order as a metal laminated film by the sputtering method.

It should be noted that by reflowing the aluminum film after these films are formed, the step coverage of the aluminum film in the holes 20c and 20d may be increased. In this reflow, the capacitor dielectric film 16a receives heat load. However, since the capacitor Q is covered with the first capacitor protect insulating film 19 having a high film density and satisfactory high step coverage, the deterioration of the first capacitor protect insulating film 19 due to reductant is prevented even when the reductant such as hydrogen is present in a reflow atmosphere.

After that, this metal laminated film is subjected to patterning by photolithography so as to form first layer metal interconnects 24 which are electrically connected to the upper electrode 17a and lower electrode 15a via the holes 20c and 20d.

Figure 2G:
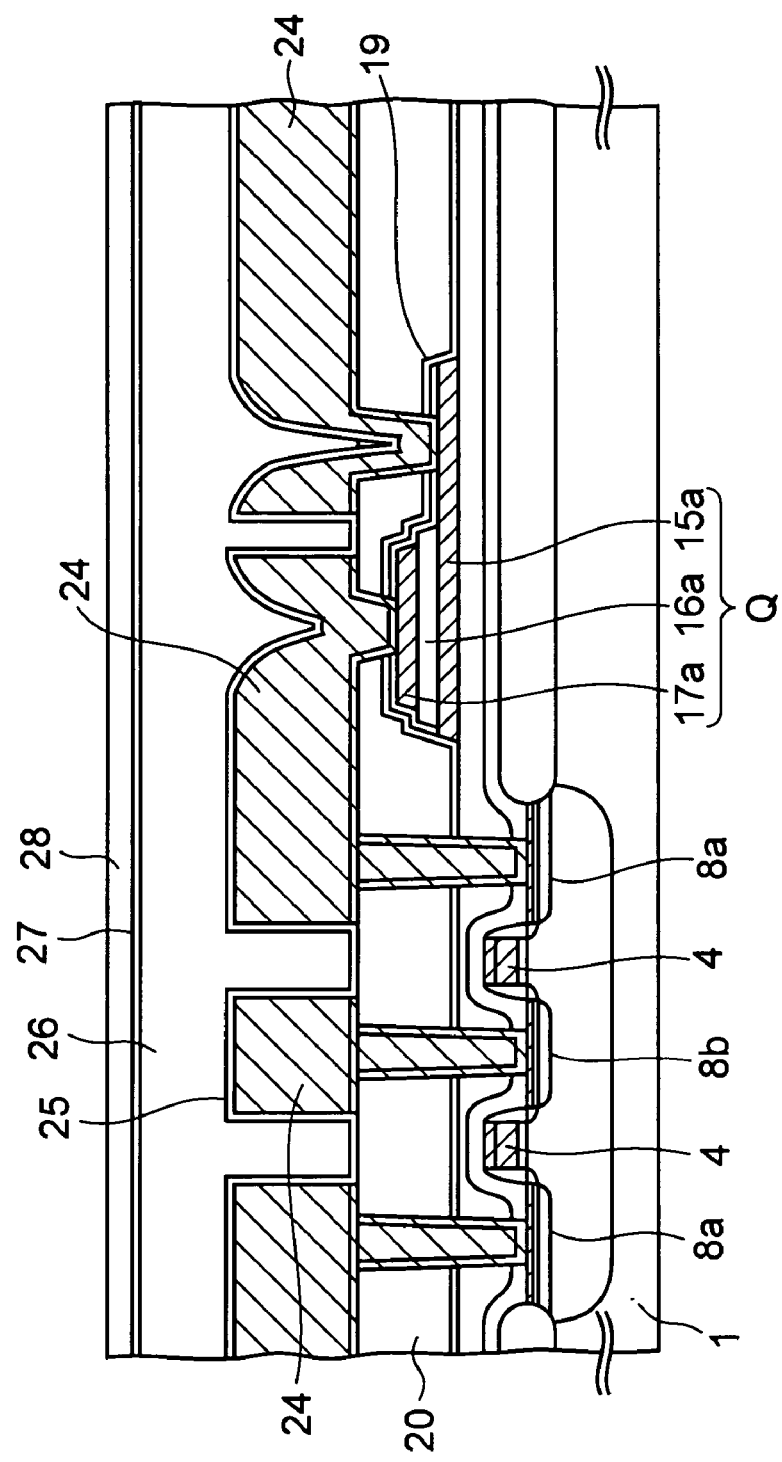

Next, as shown in FIG. 2G, a silicon nitride film is formed on each of the second insulating film 20 and the first layer metal interconnects 24 by the catalytic CVD method carried out under the condition of the substrate temperature of 200° C. or lower, and the silicon nitride film is used as a third capacitor protect insulating film 25. Since the deposition condition in this CVD method is the same as the deposition condition for the first capacitor protect insulating film 19, the descriptions for the condition are omitted here. In addition, a thickness of the third capacitor protect insulating film 25 is not particularly limited, but it is set in the present embodiment to have a thickness from 20 to 100 nm, for example 20 nm.

Further, on this third capacitor protect insulating film 25, a silicon oxide film is formed as a first interlayer insulating film 26 by the plasma CVD method, and spaces between the adjacent first layer metal interconnects 24 are completely filled with the first interlayer insulating film 26. In this plasma CVD method, a silane gas is used as a reaction gas for example.

Then, after an upper surface of the first interlayer insulating film 26 is polished and planarized by the CMP method, a silicon nitride film having a thickness from 20 to 100 nm is formed on the first interlayer insulating film 26, and the silicon nitride film is used as a fourth capacitor protect insulating film 27. As for a disposition method of this fourth capacitor protect insulating film 27, the catalytic CVD method is used since, in the catalytic CVD method, the deposition is possible at low temperature and damages to the capacitor Q is small. In this case, the substrate temperature is set to be 200° C. or lower, and the same deposition condition as the deposition condition for forming the third capacitor protect insulating film 25 is employed.

In addition, a thickness of this fourth capacitor protect insulating film 27 is formed to be thicker, for example to be 50 nm, than that of the first and third capacitor protect insulating film 19 and 25, so that the deterioration of the capacitor Q can be prevented effectively.

After that, as a first cap insulating film 28 for the fourth capacitor protect insulating film 27, a silicon oxide having a thickness of 100 nm is formed by the plasma CVD method using a silane gas as a reaction gas.

As described above, in this step, the first layer metal interconnects 24 are covered with the third capacitor protect insulating film 25 formed by the catalytic CVD method and, after that, the first interlayer insulating film 26 is formed by the plasma CVD method. Therefore, plasma damage at the time of the deposition of the first interlayer insulating film 26 is absorbed by the third capacitor protect insulating film 25, thereby making it possible to prevent the capacitor dielectric film 16a from being deteriorated by the plasma atmosphere.

Moreover, since the first layer metal interconnects 24 are prevented from being directly exposed to the above plasma atmosphere by the third capacitor protect insulating film 25, the generation of water due to catalytic action of constituent elements of the first layer metal interconnects, particularly aluminum, on the first layer metal interconnects 24 are suppressed. Therefore, the deterioration of the capacitor dielectric film 16a caused by the water can be suppressed.

In addition, the fourth capacitor protect insulating film 27 is formed between the first interlayer insulating film 26 and the first cap insulating film 28, thereby making it possible to increase blocking effect against hydrogen and water.

Figure 2H:
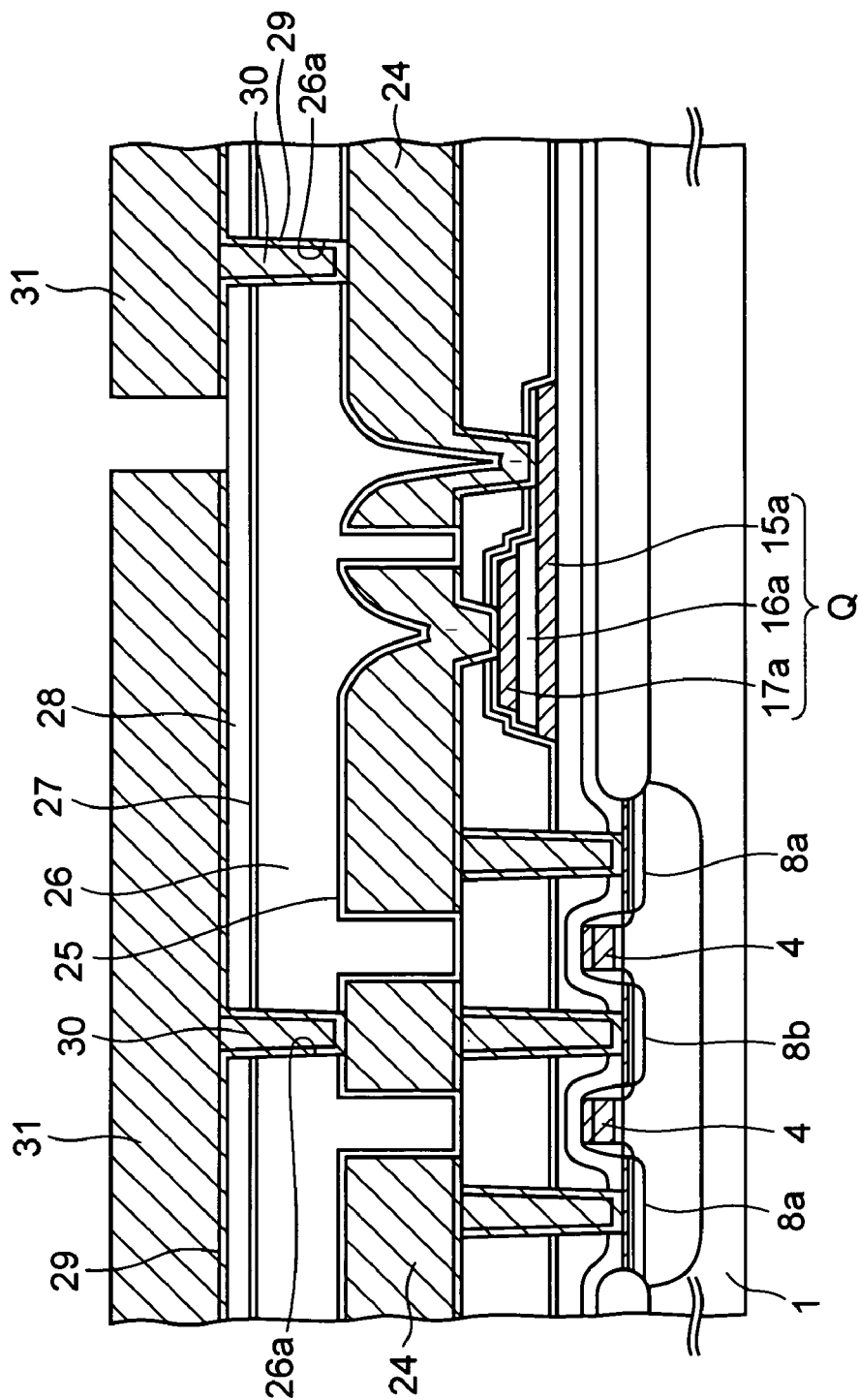

Next, steps required until the cross-sectional view shown in FIG. 2H is obtained will be described below.

First, the first cap insulating film 28 to the third capacitor insulating film 25 are subjected to patterning by photolithography, and holes 26a having a depth reaching to the first layer metal interconnects 24 are formed in these insulating films.

This patterning is carried out by the parallel plate type plasma etching equipment using a gas mixture containing $C_4F_8$, $CF_3$, Ar, and $O_2$ as an etching gas, and each of the above insulating films 25 to 28 is etched by chemical reaction with the etching gas.

Here, as the third and fourth capacitor protect insulating films 25 and 27, a silicon nitride film that can be etched by the chemical reaction with the fluorine based gas is formed instead of forming an alumina film that is etched only by the sputter etching. Therefore, the holes 26a can be easily formed, and the disadvantage that the diameters of the holes 26a become smaller at the intermediate height thereof can be prevented.

After that, the holes 26a are annealed in a nitrogen atmosphere under the conditions of the substrate temperature of 350° C. and processing time of 120 seconds so as to nitride the inner surfaces of the holes 26a. With such a nitride processing, degas from the inside of the first interlayer insulating film 26 is prevented from entering into the insides of the holes 26a.

Next, on the upper surface of the first cap insulating film 28 and the inner surfaces of the holes 26a, a titanium nitride film is formed as the first glue film 29 by the sputtering method. Further, a tungsten film is formed on this first glue film 29 by the CVD method. This tungsten film is then subjected to etch back so that third contact plugs 30 that are electrically connected to the first layer metal interconnects 24 are formed in the holes 26a.

After this etch back is finished, only the first glue film 29 is left on the first cap insulating film 28.

It should be noted that the first glue film may be formed by the CVD method. As described in FIG. 2D, by using the CVD method, the step coverage of the first glue film 29 becomes satisfactory and the contact failure of the third contact plugs 30 can be prevented since the inner surfaces of the holes 26a can be covered by the first glue film 29 even if the diameters of the holes 26a are small.

Next, a copper-containing aluminum film is formed by the sputtering method on each of the upper surfaces of the first glue film 29 and the third contact plugs 30. Then, this aluminum film and the first glue film 29 are subjected to patterning by photolithography, so that second layer metal interconnects 31 made of these laminated film is formed on the first cap insulating film 28.

Figure 2I:
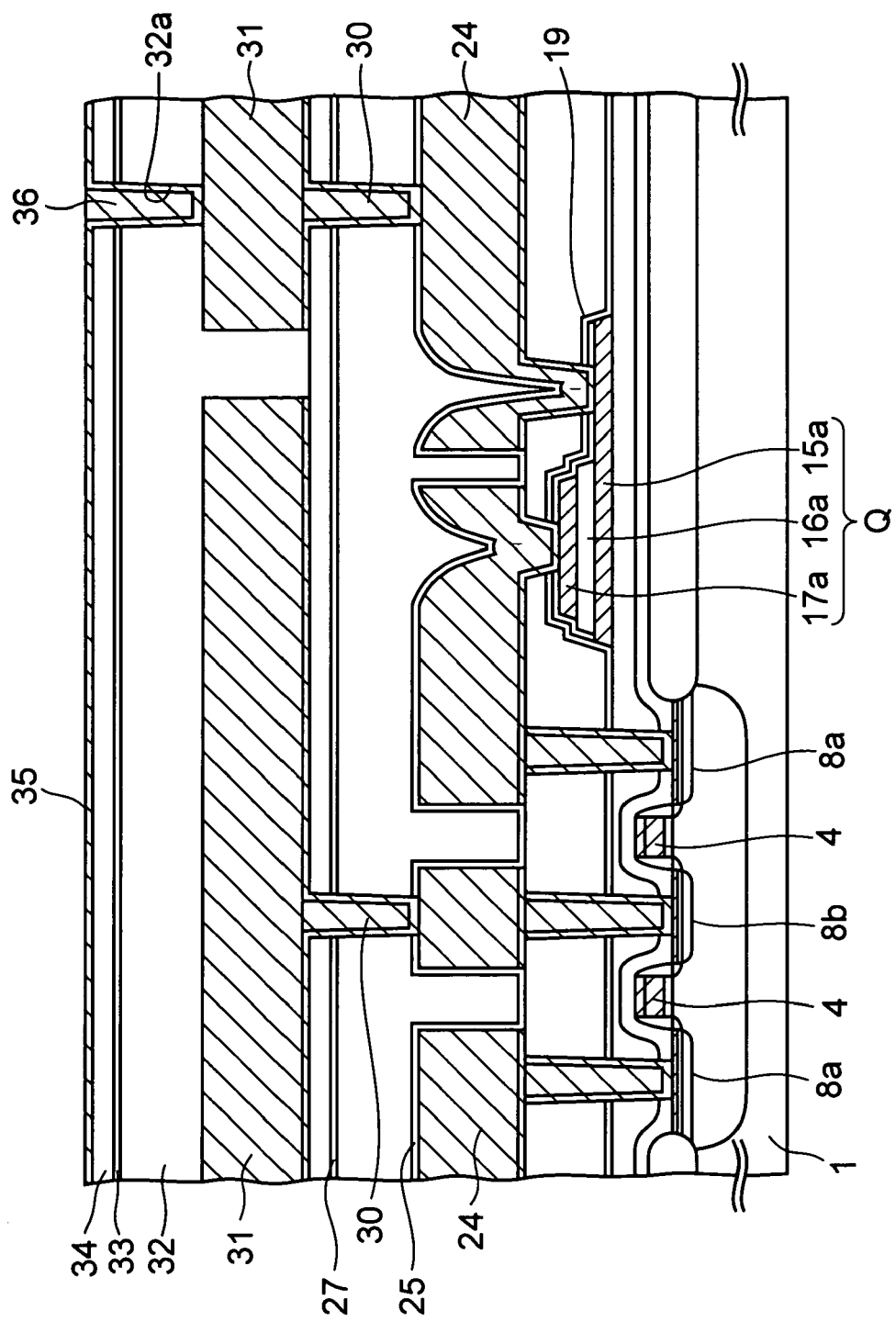

Next, steps required until the cross-sectional view shown in FIG. 2I is obtained will be described below.

First, a silicon oxide film as a second interlayer insulating film 32 is formed on the second layer metal interconnects 31 by the plasma CVD method using a silane gas, and spaces between the adjacent second layer metal interconnects 31 are completely filled with the second interlayer insulating film 32.

The unevenness is formed on the upper surface of the second interlayer insulating film 32 reflecting the shapes of the second layer metal interconnects 31. This unevenness is planarized by the CMP method.

Next, a silicon nitride film having a thickness from 20 to 100 nm, for example 50 nm, is formed on the second interlayer insulating film 32 by the catalytic CVD method using the same deposition condition as the deposition condition for forming the fourth capacitor protect insulating film 27, and the silicon nitride film is used as a fifth capacitor protect insulating film 33. As described above, the catalytic CVD method can make the substrate temperature to be 200° C. or lower at the time of deposition. In addition, plasma is not used in the catalytic CVD method. Therefore, the damages that the capacitor dielectric film 16a receives at the time of deposition of the fifth capacitor protect insulating film 33 are considerably small.

After that, as a second cap insulating film 34 for the fifth capacitor protect insulating film 33, a silicon oxide film having a thickness of approximately 100 nm is formed by the plasma CVD method using a silane gas as a reaction gas.

Next, each of the insulating films 32 to 34 is subjected to pattering by photolithography, so that holes 32a having a depth reaching the second layer metal interconnects 31 are formed in these insulating films.

In order to prevent degas from entering from the second interlayer insulating film 32 into the holes 32a, the holes 32a are annealed in nitrogen atmosphere under the conditions of substrate temperature of 350° C. and processing time of 120 seconds so as to nitride the inner surfaces of the holes 32a.

After that, on the inner surfaces of the holes 32a and the upper surface of the second cap insulating film 34, a titanium nitride film is formed by the sputtering method, and the titanium nitride film is used as a second glue film 35.

Further, a tungsten film is formed on this second glue film 35 by the CVD method using a tungsten hexafluoride gas. After that, this tungsten film is subjected to etch back, so that fourth contact plugs 36 that are electrically connected to the second layer metal interconnects 31 are formed only in the holes 32a. It should be noted that in the etch back of the tungsten film, the second glue film 35 is not etched and left on the second cap insulating film 34.

Figure 2J:
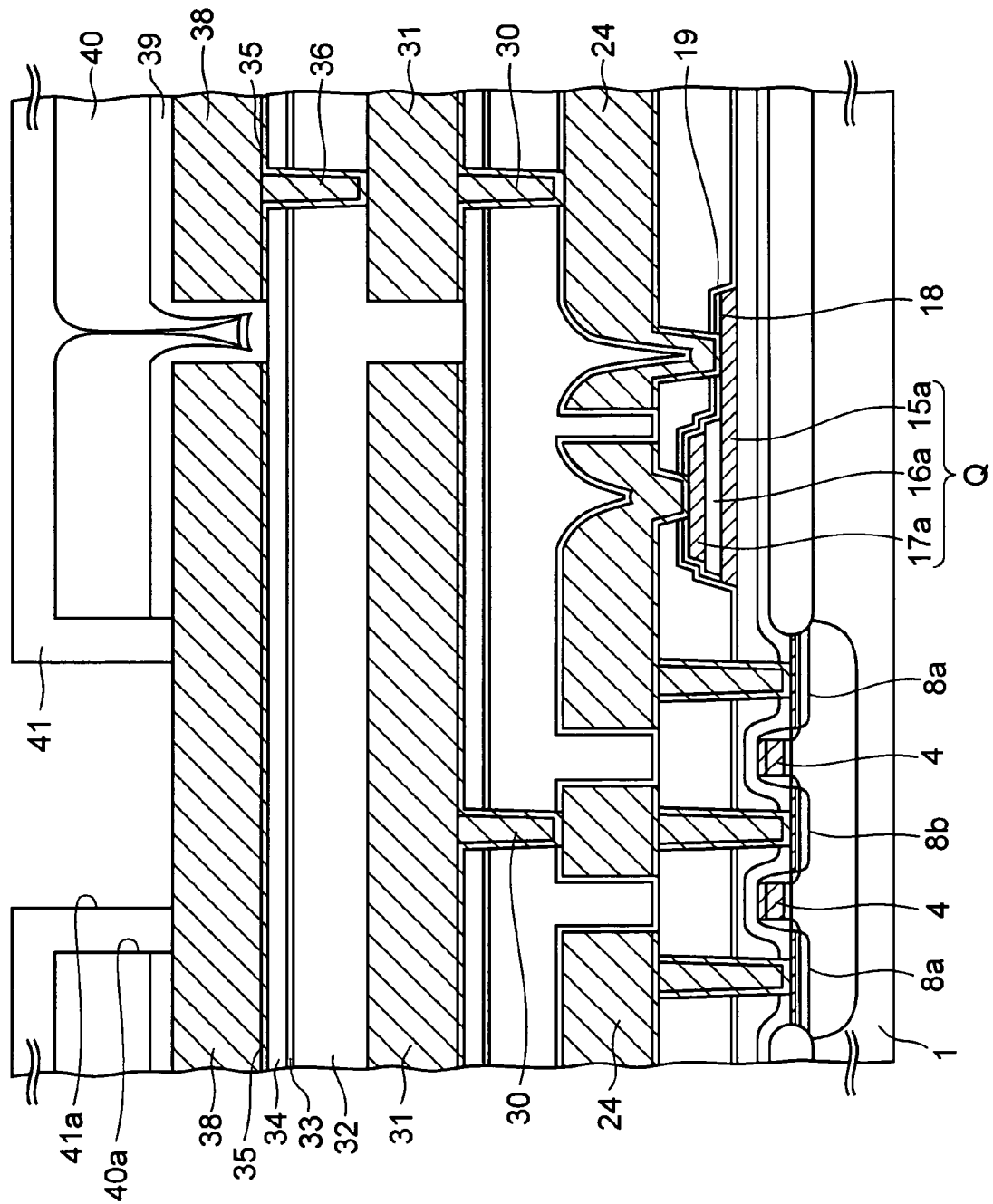

Next, steps required until the cross-sectional view shown in FIG. 2J is obtained will be described below.

First, a copper-containing aluminum film is formed on the second glue film 35 by the sputtering method. This aluminum film and the second glue film 35 are subjected to patterning so that third layer metal interconnects 38 are formed on the second cap insulating film 34.

Next, a silicon oxide film having a thickness of approximately 100 nm is formed on the third layer metal interconnects 38 by the plasma CVD method, and this silicon oxide film is used as a first cover film 39.

Further, a silicon nitride film having a thickness of approximately 350 nm is formed on this first cover film 39 as a second cover insulating film 40. The deposition method of the second cover insulating film 40 is not particularly limited, and may be a plasma CVD method as well as a catalytic CVD method that hardly damages the capacitor Q. Since a plurality of the protective insulating films such as the fifth capacitor protect insulating film 33 are formed under the second cover insulating film 40, the damages that the capacitor Q receives by the plasma atmosphere are fewer even when the second cover insulating film 40 is formed by the plasma CVD method.

Next, the above first and second cover insulating films 39 and 40 are patterned by photolithography, thereby forming opening 40a in the insulating films 39 and 40, from which the third layer metal interconnects 38 expose.

Next, a resin layer 41 made of polyimide having a thickness of approximately 2 to 6 μm is formed by coating the upper surface of entire silicon substrate 1 with polyimide. After that, the resin layer 41 is patterned by photolithography, so that a window 41a is formed in the resin layer 41 located in the opening 40a, and the upper surface of the third layer metal interconnect 38 is exposed from the windows 41a. The exposed portion of the third layer metal interconnect 38 function as bonding pad, and in the latter step, bonding wire such as gold wire are bonded to the bonding pad.

Up to this step, a basic structure of the semiconductor device according to the present embodiment has been completed.

According to the present embodiment, the catalytic CVD method is used as the deposition method of the first capacitor protect insulating film 19 covering the capacitor Q. Since the first capacitor protect insulating film 19 made of silicon nitride formed by the catalytic CVD method has satisfactory step coverage, the film 19 is formed to have a sufficient thickness on the side surface of the capacitor dielectric film 16a. Therefore, the permeation of hydrogen and water into the capacitor dielectric film 16a from the side surface thereof can be effectively prevented.

In addition, the catalytic CVD method can make substrate temperature to be 200° C. or lower. Therefore, heat load, which is one of the causes of deteriorating the capacitor dielectric film 16a, can be reduced.

Further, the catalytic CVD method increases the film density of the first capacitor protect insulating film 19, so that hydrogen permeation prevention capability of the first capacitor protect insulating film 19 can be increased.

Here, it can be considered that silicon nitride film, which is formed by the catalytic CVD method and has a high film density, is applied to the second capacitor protect insulating film 18. However, as described in FIG. 1F, since recovery annealing for the capacitor dielectric film 16a is carried out in a situation where the second capacitor protect insulating film 18 is formed, oxygen in an annealing atmosphere becomes incapable of reaching to the capacitor dielectric film 16a when the above described high density film is formed as the capacitor dielectric film 16a, and the effect of the recovery annealing decreases. Therefore, it is preferable that a metal oxide film, such as alumina film, be formed as the second capacitor protect insulating film 18 which is formed directly on the capacitor Q.

Further, in the present embodiment, as described in FIG. 2C, the first capacitor protect insulating film 19 is made of silicon nitride. Therefore, at the time of forming the first and second contact holes 20a and 20b by etching, the first capacitor protect insulating film 19 can be easily etched by the chemical reaction with the etching gas. As a result, such a disadvantage that the diameters of the holes 20a and 20b become smaller below the first capacitor protect insulating film 19 can be avoided. Therefore, it can be made possible to stabilize the contact resistance between the first and second contact plugs 21a and 21b (see, FIG. 2D) and the refractory metal silicide layer 9.

In such etching using chemical reaction, the generation of etching product accompanying to the etching is difficult to occur. Therefore, the etching product is not left in the holes 20a and 20b, and the deterioration of the contact resistance of the first and second contact plugs 21a and 21b caused by the etching product can be prevented.

In addition, in the present embodiment, as described in FIG. 2G, the first layer metal interconnects 24 is covered with the third capacitor protect insulating film 25 formed by the catalytic CVD method, and then the first interlayer insulating film 26 is formed by the plasma CVD method. Therefore, the first layer metal interconnects 24 are not directly exposed to the plasma atmosphere at the time of the deposition of the first interlayer insulating film 26. Thus, the generation of water caused by the catalytic action of the first layer metal interconnects 24 are suppressed, and hence the deterioration of the capacitor dielectric film 16a caused by this water can be prevented.

Further, since the fourth capacitor protect insulating film 27 is formed on the first interlayer insulating film 26 by the catalytic CVD method, it is made possible to prevent hydrogen and water from permeating to the capacitor dielectric film 16a more securely.

Moreover, in the present embodiment, a silicon nitride film which can be etched by the chemical reaction with an etching gas is formed as the fourth capacitor protect insulating film 27. Therefore, the holes 26a (see, FIG. 2H) become easy to be formed in the first interlayer insulating film 26, and the disadvantage that the diameters of the holes 26a become smaller below the fourth capacitor protect insulating film 27 can be prevented. According to this, the third contact plug 30 and the first layer metal interconnects 24 can be connected each other with a sufficient contact area, thereby making it possible to stabilize the contact resistance of the third contact plug 30.

Here, a thickness of the first, third to fifth capacitor protect insulating films 19, 25, 27, and 33 are not particularly limited. However, it is revealed that the deterioration of the capacitor dielectric film 16a can be preferably prevented by setting the thicknesses of these films so as to be thicker toward the upper films.

Further, since the silicon nitride film having relative permittivity of approximately 6.2 is used as the first and third to fifth capacitor protect insulating films 19, 25, 27 and 33, the parasitic capacitance between interconnects is reduced compared with the case where the alumina film having high relative permittivity of approximately 9.34 is formed as these insulating films. Therefore, the distance between the interconnects can be shortened by reducing the design rule, thereby making it possible to develop the minimization of semiconductor devices.

As describe above, according to the present invention, the capacitor protect insulating film is formed by the catalytic CVD method. Therefore, the film density and step coverage of the capacitor protect insulating film can be increased, and the capacitor can be effectively protected from reductant.

In addition, the capacitor protect insulating film is made of a silicon nitride film. Therefore, the capacitor protect insulating film can be easily etched by the chemical reaction with an etching gas, even when hole is formed through the capacitor protect insulating film, thereby capable of increasing the processing accuracy of the hole.

Further, the above-described capacitor protect insulating film is formed on the metal interconnect, and then the interlayer insulating film is formed, so that the deterioration of the capacitor dielectric film caused by direct contact between the metal interconnect and the deposition atmosphere of the interlayer insulating film can be prevented.

What is claimed is:

1. A method for manufacturing a semiconductor device, comprising:
    forming a first insulating film on a semiconductor substrate;
    forming a capacitor in which a lower electrode, a capacitor dielectric film made of ferroelectric material and an upper electrode are laminated in this order on the first insulating film;
    forming a second insulating film covering the capacitor;
    forming a first metal interconnect on the second insulating film;
    forming a silicon nitride film as the first capacitor protect insulating film on the metal interconnect by a catalytic CVD method;
    forming an interlayer insulating film on the first capacitor protect insulating film;
    forming a silicon nitride film on the interlayer insulating film as a second capacitor protect insulating film by the catalytic CVD method;
    forming a third insulating film on the second capacitor protect insulating film;
    forming an glue film on the third insulating film; and
    forming a second metal interconnect on the glue film.

2. The method of manufacturing a semiconductor device according to claim 1, wherein a substrate temperature is set to 200° C.

3. The method of manufacturing a semiconductor device according to claim 1, wherein a thickness of the third insulating film is set within a range from 20 to 100 nm.

4. The method of manufacturing a semiconductor device according to claim 1, further comprising:
    forming a first conductive film as the lower electrode, a ferroelectric film and a second conductive film as the upper electrode in this order on the first insulating film;
    patterning the second conductive film to form the upper electrode;
    patterning the ferroelectric film to form the capacitor dielectric film;
    forming a metal oxide film as a fourth capacitor protect insulating film covering the upper electrode, the capacitor dielectric film, and the first conductive film; and
    patterning the fourth capacitor protect insulating film and the first conductive film to leave the fourth capacitor protect insulating film only on the lower electrode, the capacitor dielectric film, and the upper electrode.

5. The method of manufacturing a semiconductor device according to claim 4, wherein an alumina film is formed as the metal oxide film in the fourth capacitor protect insulating film.

6. The method of manufacturing a semiconductor device according to claim 4, further comprising:
    annealing the capacitor dielectric film in an oxygen-containing atmosphere after forming the fourth capacitor protect insulating film and before forming the third capacitor protect insulating film.

7. The method of manufacturing a semiconductor device according to claim 1, further comprising:
    forming an impurity diffusion region in the semiconductor substrate;
    forming a hole in the first insulating film, the third capacitor protect insulating film, and the second insulating film above the impurity diffusion region; and
    forming a contact plug, which is electrically connected to the impurity diffusion region, in the hole.

8. The method of manufacturing a semiconductor device according to claim 7, wherein forming the hole is carried out by etching the first insulating film, the third capacitor protect insulating film, the fourth capacitor protect insulating film, and the second insulating film by a plasma etching method using an etching gas containing a fluorine compound.

9. The method of manufacturing a semiconductor device according to claim 7, wherein a source/drain region of a MOS transistor is formed as the impurity diffusion region.

10. The method of manufacturing a semiconductor device according to claim 1, wherein aluminum is used as a constituent material of the metal interconnect, and the interlayer insulating film is formed by a plasma CVD method.

11. The method of manufacturing a semiconductor device according to claim 10, wherein a silicon oxide film is formed as the interlayer insulating film.

12. The method of manufacturing a semiconductor device according to claim 1, further comprising:
    forming a hole in the first capacitor protect insulating film, the interlayer insulating film, the second capacitor protect insulating film and the third insulating film above the first metal interconnect; and
    forming a contact plug, which is electrically connected to the first metal interconnect, in the hole.

13. The method of manufacturing a semiconductor device according to claim 1, wherein a thickness of the second capacitor insulating film is set to be thicker than that of the first capacitor protect insulating film.

14. The method of manufacturing a semiconductor device according to claim 1, further comprising:
    forming a silicon nitride film by a catalytic CVD method as a third capacitor protect insulating film covering the capacitor and the first insulating film.

15. The method of manufacturing a semiconductor device according to claim 12, wherein a glue film is formed in the hole.

16. The method of manufacturing a semiconductor device according to claim 1, wherein the third insulating film is a silicon oxide film.

17. The method of manufacturing a semiconductor device according to claim 1, wherein the glue film is a titanium nitride film.

* * * * *